US012772522B2

(12) United States Patent
Shah et al.

(10) Patent No.: US 12,772,522 B2
(45) Date of Patent: Oct. 20, 2026

(54) FORMATION OF METAL CONTACTS TO SILICON GERMANIUM LAYERS WITH ETCH RESISTIVE CAP LAYERS

(71) Applicant: Intel Corporation, Santa Clara, CA (US)

(72) Inventors: Rushabh D. Shah, Hillsboro, OR (US); Glenn Glass, Portland, OR (US); Mohammad R. Hasan, Aloha, OR (US); Anand Murthy, Portland, OR (US); Cory C. Bomberger, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 17/561,915

(22) Filed: Dec. 24, 2021

(65) Prior Publication Data

US 2023/0207655 A1 Jun. 29, 2023

(51) Int. Cl.

*H10D 62/83* (2025.01)
*H10D 30/62* (2025.01)

(Continued)

(52) U.S. Cl.

CPC ......... *H10D 62/83* (2025.01); *H10D 30/6211* (2025.01); *H10D 30/6735* (2025.01);

(Continued)

(58) Field of Classification Search

CPC ............... H10D 62/83; H10D 30/6211; H10D 30/6735; H10D 30/6757; H10D 62/118; H10D 64/62; H10D 30/014; H10D 30/024; H10D 30/43; H10D 30/62; H10D 30/6219; H10D 30/797; H10D 62/021; H10D 62/60;

(Continued)

(56) References Cited

U.S. PATENT DOCUMENTS 9,397,214 B1 * 7/2016 Chan ...................... H10D 30/62
2007/0238236 A1 10/2007 Cook, Jr. et al.

(Continued)

FOREIGN PATENT DOCUMENTS

CN 108447824 A 8/2018

OTHER PUBLICATIONS

EPO Extended European Search Report in EP Application Serial No. 22203503.2 mailed on Oct. 25, 2023 (9 pages).

*Primary Examiner* — Christine S. Kim
*Assistant Examiner* — Nathalie R Fayette
(74) *Attorney, Agent, or Firm* — Alliance IP, LLC

(57) ABSTRACT

Cap layers are formed on silicon germanium (SiGe) source/drain regions to provide etch resistance to processing steps that can occur in a semiconductor manufacturing process between formation of the SiGe source/drain regions and metal contact formation. The cap layers comprise boron and are thin (e.g., 2 nm or less) to provide for a low metal contact resistance. The atomic concentration of boron in the second layer is in a range of about 0.2-20%. In addition to providing etch resistance, the cap layer provides for a thermally stable contact resistance as the cap layer can prevent or limit the creation of voids in the SiGe layer by preventing or limiting the diffusion of germanium from the SiGe layer into the metal in subsequent annealing and other high-temperature processing steps.

25 Claims, 12 Drawing Sheets

(51) Int. Cl.
*H10D 30/67* (2025.01)
*H10D 62/10* (2025.01)
*H10D 64/62* (2025.01)

(52) U.S. Cl.
CPC ....... *H10D 30/6757* (2025.01); *H10D 62/118* (2025.01); *H10D 64/62* (2025.01)

(58) Field of Classification Search
CPC .. H10D 62/822; H10D 62/832; H10D 62/151; H10D 62/121; H10D 64/251; H10D 64/01; H10D 64/256; B82Y 10/00
See application file for complete search history.

(56) References Cited

U.S. PATENT DOCUMENTS

| | | | | |
|---|---|---|---|---|
| 2013/0277752 | A1* | 10/2013 | Glass et al. | H10D 84/017 257/369 |
| 2015/0236125 | A1 | 8/2015 | Tu | |
| 2018/0190810 | A1 | 7/2018 | Li et al. | |
| 2019/0067013 | A1* | 2/2019 | Wang et al. | H10D 64/017 |
| 2019/0319098 | A1 | 10/2019 | Tai et al. | |
| 2021/0305404 | A1* | 9/2021 | Drowley | H10D 62/124 |
| 2023/0087399 | A1* | 3/2023 | Nandi | H10D 30/43 257/288 |

* cited by examiner

FORMATION OF METAL CONTACTS TO SILICON GERMANIUM LAYERS WITH ETCH RESISTIVE CAP LAYERS

BACKGROUND

Metal contacts can be used to provide electrically conductive connections to silicon or silicon germanium (SiGe) source/drain regions of field-effect transistors. Metal contacts have an associated parasitic resistance that, if large enough, can affect transistor performance.

DETAILED DESCRIPTION

Figure 1A:
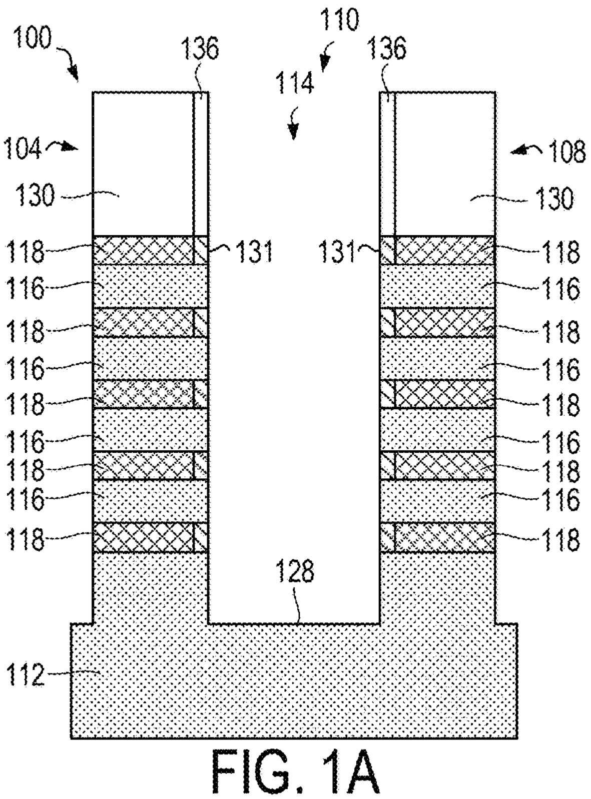
FIGS. 1A-1J illustrate an example simplified metal contact formation process comprising formation of a cap layer over a GAAFET source/drain layer.

The source/drain regions of PMOSFETs (p-type metal-oxide-silicon field-effect transistors (FETs)) can comprise p-type silicon germanium (SiGe) layers epitaxially grown on a bulk silicon, silicon-on-insulator, or another suitable substrate. Silicon germanium source/drain regions can introduce strain into the channel region of a MOSFET and the induced strain can cause the silicon atoms in the channel to stretch further apart than they would be in the absence of strain. This increased atomic spacing results in increased charge carrier mobility in the channel, which can translate into increased transistor drive current.

Metal contacts to silicon germanium can be thermally unstable in that their resistance (contact resistance) increases after being subjected to annealing and other high-temperature processing steps that occur in a semiconductor device manufacturing process after contact formation. The back end of line (BEOL) portion of a semiconductor device manufacturing process can involve numerous annealing and other high-temperature processing steps, the cumulative effect of which can cause metal contact resistance to increase by more than 50% in some cases. The creation of voids in a silicon germanium layer at the contact metal-silicon germanium interface due to diffusion of germanium from the silicon germanium layer into the contact layer during the annealing and other high-temperature processing steps is understood to be at least partially responsible for metal contact thermal instability. The increased resistance of metal contacts due to their thermal instability can impact the performance of transistors having silicon germanium source/drain regions.

Metal contacts to epitaxially-grown silicon germanium source/drain layers can further suffer from reliability and performance issues due to the inadvertent (undesired) etching of such source/drain layers by processing steps between epitaxial growth of source/drain layers and contact formation. For example, a wet etch process to remove patterned hard masks can expose the silicon germanium source/drain layers to etchants that perform inadvertent etching of the silicon germanium layer. A high germanium concentration in silicon germanium source/drain layers is desirable to achieve a low contact resistance, but the amount of inadvertent etching of the silicon germanium layers that can occur can depend on the germanium concentration, with silicon germanium layers having a higher amount of germanium concentration experiencing a greater amount of inadvertent etching.

Existing efforts to improve the etch resistance of epitaxially grown SiGe source/drain layers include reducing the concentration of germanium in the SiGe layer and forming a silicon-rich cap layer on top of the epitaxial SiGe layers. However, reducing the germanium concentration in the SiGe layers can increase the contact resistance. The concentration of germanium in a SiGe layer in-situ doped with a reduced concentration of germanium could be supplanted via ion implantation of germanium to achieve a low contact resistance. However, the addition of an ion implantation step would increase processing cost and could result in damage to the source/drain epitaxial layers. Further, germanium implanted into a source/drain region could extend into the transistor channel due to ion implantation straggle, which could result in degraded transistor performance. The addition of a silicon-rich cap layer has the potential disadvantage of causing a higher metal contact resistance if any of the cap layer survives the etch steps between source/drain epitaxial layer growth and metal contact deposition.

Described herein are etch resistive cap layers for use with metal contacts to silicon germanium layers. The cap layers are etch resistant and thus provide increased metal contact reliability and performance by limiting the amount of inadvertent etching of underlying silicon germanium layers, are thin enough to enable metal contacts with low contact resistance, and provide for metal contacts that have a thermally stable contact resistance. The cap layer comprises boron and can have a boron concentration in the cap layer can be in the range of about 10-100%. The cap layer is thin to ensure a low contact resistance. In some embodiments, the thickness of the cap layer is less than about 2 nm. The presence of the cap layer can reduce (or prevent) the diffusion of germanium from the silicon germanium layer into the contact metal and thus reduce (or prevent) the formation of voids in the SiGe layer during subsequent annealing and other high-temperature processes, which can increase contact resistance. The cap layer can further reduce (or prevent) inadvertent etching of the SiGe layer during processing steps between SiGe layer epitaxial growth and metal contact formation. The metal contacts formed with the formation of an etch resistant cap layer over the silicon germanium layer can have a lower parasitic contact resistance than contacts formed without such an etch resistant cap layer (owing to the thermal instability of their contact resistance) and can thus improve the performance of transistors having source/drain contacts formed with cap layers as described herein.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact.

Furthermore, the terms "comprising," "including," "having," and the like, as used with respect to embodiments of the present disclosure, are synonymous. For example, the portion of a first layer or feature that is substantially perpendicular to a second layer or feature can include a first layer or feature that is +/−20 degrees from a second layer or feature, a first surface that is substantially parallel to a second surface can include a first surface that is within several degrees of parallel from the second surface, and a contact resistance value that is substantially unchanged after one or more annealing processes include contact resistance values that change by 5% or less relative to their value prior to being subjected to one or more annealing processes. As used herein, the term "about" in reference to a value of a feature (e.g., height, width, spacing) or upper and lower limits of a range of values for a feature includes features values that are within several percent of the stated feature value, feature value lower range limit, or feature value upper range limit.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components. For example, with reference to FIG. 1G, the contact metal layer 152 is located on the semiconductor layer 140, whether or not there is a barrier layer 148 and/or a cap layer 144 between the contact metal layer 152 and the semiconductor layer 140.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Certain terminology may also be used herein for the purpose of reference only, and thus are not intended to be limiting. For example, terms such as "upper,", "uppermost", "lower," "above," "below," "bottom," and "top" refer to directions in the Figures to which reference is made. Further, terms such as "front," "back," "rear,", "side", "vertical", and "horizontal" describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

As used herein, the term "integrated circuit component" refers to a packaged or unpacked integrated circuit product. A packaged integrated circuit component comprises one or more integrated circuit dies mounted on a package substrate with the integrated circuit dies and package substrate encapsulated in a casing material, such as a metal, plastic, glass, or ceramic. In one example, a packaged integrated circuit component contains one or more processor units mounted on a substrate with an exterior surface of the substrate comprising a solder ball grid array (BGA). In one example of an unpackaged integrated circuit component, a single monolithic integrated circuit die comprises solder bumps attached to contacts on the die. The solder bumps allow the die to be directly attached to a printed circuit board. An integrated circuit component can comprise one or more of any computing system component described or referenced herein or any other computing system component, such as a processor unit (e.g., system-on-a-chip (SoC), processor core, graphics processor unit (GPU), accelerator, chipset processor), I/O controller, memory, or network interface controller.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

FIGS. 1A-1J illustrate an example simplified metal contact formation process comprising formation of a cap layer over a GAAFET source/drain layer. FIGS. 1A-1J illustrate cross-sectional views of the formation of a metal contact to a source/drain layer formed in a trench between gate stacks of a pair of stacked gate-all-around field-effect transistors (GAAFETs). FIGS. 1A, 1C, 1E, 1G, and 1I illustrate cross-sectional views of a structure 100 during various processing phases to form a gate stack 104 of a first stacked GAAFET and a gate stack 108 of a second stacked GAAFET taken along a plane passing through the gate stacks 104 and 108 and a contact region 110 positioned between the gate stacks 104 and 108. FIGS. 1B, 1D, 1F, 1H, and 1J illustrate cross-sectional views orthogonal to the cross-sectional views illustrated in FIGS. 1A, 1C, 1E, 1G, and 1I. Referring to the stacked GAAFET 760 illustrated in FIG. 7D, the cross-sectional views in FIGS. 1A, 1C, 1E, 1G, and 1I are taken along a plane similar to plane A in FIG. 7D (with the cross-sectional views in FIGS. 1A, 1C, 1E, 1G, and 1I illustrating two stacked GAAFETs and the plane A passing through just one stacked GAAFET). FIGS. 1B, 1D, 1F, 1H, and 1J are taken along a plane similar to plane B in FIG. 7D, which is orthogonal to plane A.

Figure 1B:
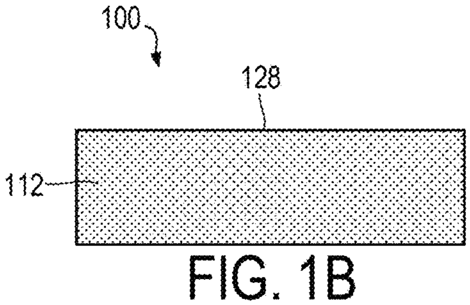

FIGS. 1A-1B illustrate cross-sectional views of the structure 100 after formation of a cavity 114 defined by a surface 128 of a substrate 112 and the gate stacks 104 and 108, which are located on the substrate 112. The substrate 112 can comprise be, for example, a bulk silicon substrate, a silicon-on-insulator substrate, or another suitable substrate. The individual gate stacks 104 and 108 comprise four semiconductor layers 116 located above and separate from the substrate 112. The semiconductors layers 116 are stacked vertically and are substantially parallel to a surface 128 of the substrate 112. The semiconductor layers 116 are interleaved between five sacrificial layers 118. Cavity spacers 131 are positioned between the sacrificial layers 118 and the cavity 114. The semiconductor layers 116 will become the channel regions of the first and second stacked GAAFETs. The individual gate stacks 104 and 108 further comprise a dummy gate 130 located on the uppermost sacrificial layer 118 and a gate spacer 136 positioned between the dummy gate 130 and the cavity 114. The semiconductor layers 116 can comprise silicon, silicon and germanium, or another suitable semiconductor. The semiconductor layers 116 can be doped with one or more n-type dopants, such as phosphorous, arsenic, antimony, or another suitable n-type dopant, or one or more p-type dopants, such as boron, gallium, indium, or another suitable p-type dopant. In some embodiments, the sacrificial layers 118 can be silicon germanium layers.

In some embodiments, the structure 100 as illustrated in FIGS. 1A and 1B can be formed by the following process. A stack of semiconductor layers 116 with intervening silicon germanium (SiGe) sacrificial layers 118 is formed on a substrate 112. The stack is patterned into fins that are isolated from each other by the formation of isolation regions between the fins. The isolation regions between the fins can be performed by, for example, a shallow trench isolation process. The dummy gates 130 and the gate spacers 136 are formed on the fin, followed by an etch of the fin to the surface 128 of the substrate 112 (with the dummy gates 130 and the gate spacers 136 being used as an etch mask) to form the gate stacks 104 and 108 and the intervening cavity 114. A SiGe cavity etch is then performed, which removes a portion of the sacrificial layers 118 adjacent to the cavity 114 and the etched portion of the sacrificial layers 118 are filled by cavity spacers 131.

Figure 1C:
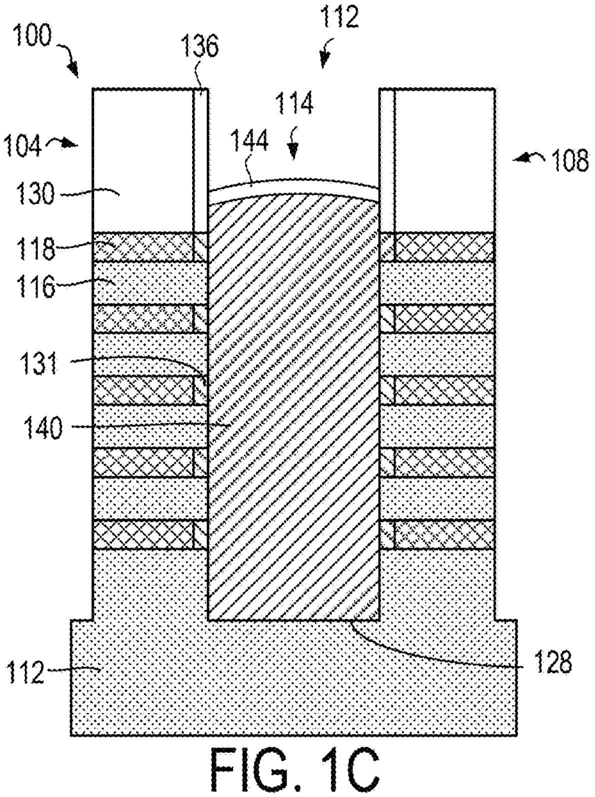
Figure 1D:
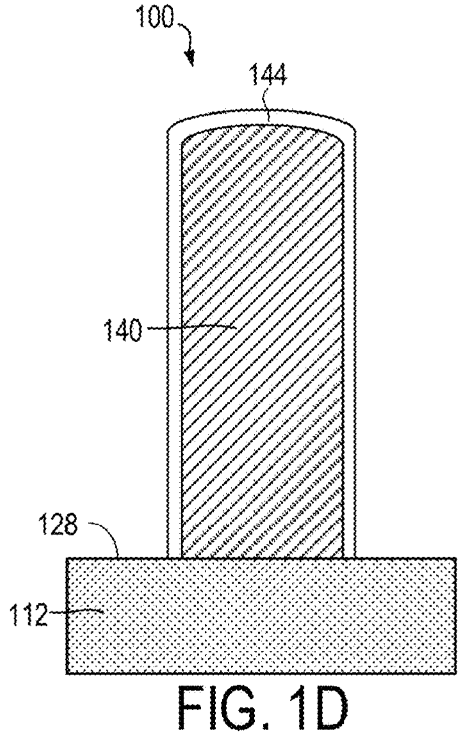

FIGS. 1C-1D illustrate cross-sectional views of the structure 100 after formation of a semiconductor layer 140 that fills at least a portion of the cavity 114 and the formation of a cap layer 144 on top of the semiconductor layer 140. The semiconductor layer 140 is positioned adjacent to the substrate 112 and the semiconductor layers 116 of the gate stacks 104 and 108. The semiconductor layer 140 acts as a source/drain region for the first and second stacked GAAFETs. The semiconductor layer 140 can comprise silicon, silicon and germanium, or another suitable semiconductor material. In some embodiments, the semiconductor layer 140 can comprise one or more n-dopants, such as phosphorous, arsenic, antimony, or another suitable n-type dopant. In other embodiments, the semiconductor layer can comprise one or more p-type dopants, such as boron, gallium, indium, or another suitable p-type dopant. In some embodiments, the semiconductor layer 140 can be epitaxially grown. The n-type dopants or p-dopants of an epitaxy layer can be introduced via in situ doping during formation of the epitaxial layer layers. In some embodiments, the semiconductor layer is an epitaxially grown SiGe layer. The semiconductor layer 140 can have a high concentration of germanium throughout the semiconductor layer 140 or in one or more portions of the semiconductor layer 140 to enable a low metal contact resistance.

As discussed above, the cap layer 144 comprises boron and acts to protect the semiconductor layer 140 from undesired etching during processing steps that occur after semiconductor layer 140 formation and contact metal deposition. The cap layer 144 can further reduce (or prevent) the formation of voids in the semiconductor layer 140 during subsequent annealing and other high-temperature processing steps that can cause the contact resistance to exhibit thermal instability. The cap layer 144 is made thin to keep the contact resistance low. In some embodiments, the cap layer 144 has a thickness of 2 nm or less. In some embodiments, the cap layer 144 has a boron concentration in the range of about 10-100%. In embodiments where the cap layer 144 does not entirely comprise boron, the cap layer 144 can further comprise silicon or silicon and germanium. In some embodiments, the cap layer 144 can comprise a ternary alloy having the chemical formula $Si_xGe_yB_z$, where x, y, and z can have any value where x+y+z=1.

In some embodiments, the cap layer 144 is and the semiconductor layer 140 are formed as part of the same processing step. That is, formation of the semiconductor layer 140 and formation of the cap layer 144 are performed in the same manufacturing tool with the substrate 112 not being removed from the tool between formation of the semiconductor layer 140 and formation of the cap layer 144. In embodiments where the semiconductor layer 140 is epitaxially grown on a wafer, the formation of the cap layer 144 can be formed in the same manufacturing tool in which the semiconductor layer 140 was grown.

Figure 1E:
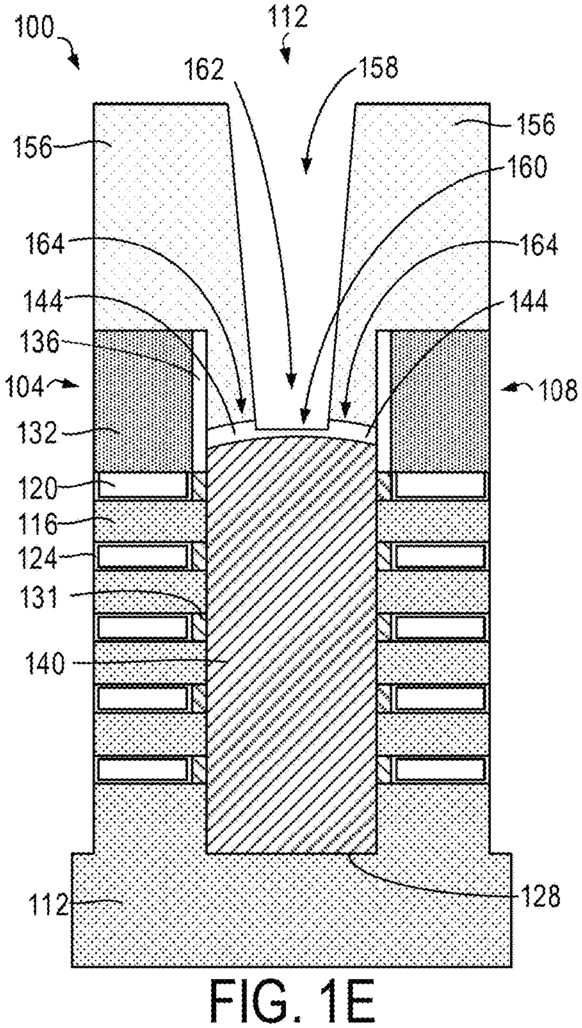
Figure 1F:
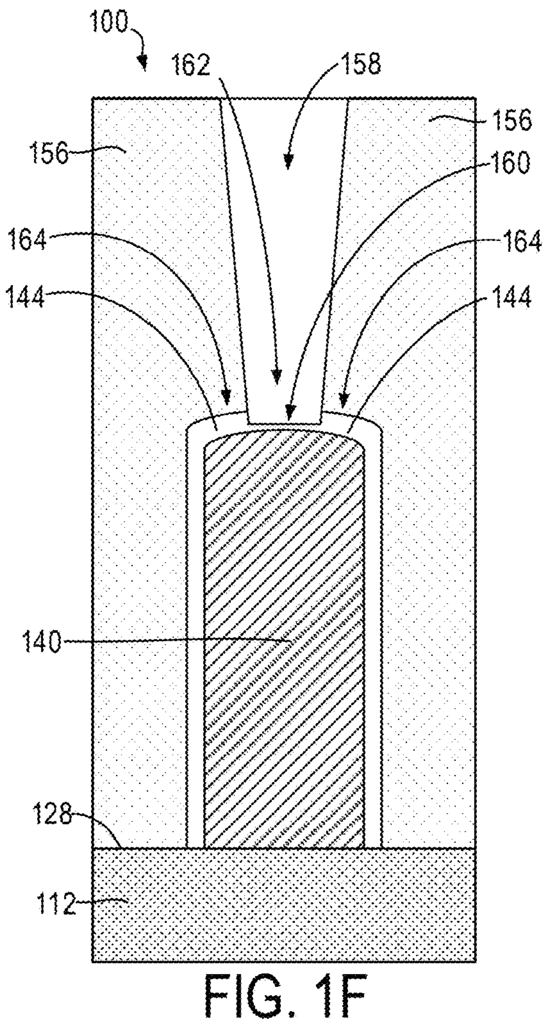

FIGS. 1E-1F illustrate cross-sectional views of the structure 100 after performance of the processing steps after cap layer formation and immediately prior to contact metal formation. The processing steps after cap layer formation and prior to contact metal formation include etch of the sacrificial SiGe layers 118, formation of gate layers 120 in place of the sacrificial SiGe layers 118, formation of gate dielectric layers 124 that encompass the gate layers 120. The semiconductor layers 116 act as the channel regions for the first and second stacked GAAFETs with the gate layers 120 controlling the current flow through the channel regions. The cavity spacers 131 isolate the gate layers 120 from the semiconductor layer 140 formed in the cavity 114.

The processing steps between cap layer formation and contact metal formation further include the dummy gates 130 being etched away, gate electrodes 132 being formed in their place, formation of an isolation region 156 over the gate electrodes 132 and the cap layer 144, and etching of the isolation region 156 to form a trench 158 in which a metal contact to the semiconductor layer 140 will be formed. In some embodiments, etch processes that the structure 100 is subjected to after formation of the cap layer 144 and prior to formation of the metal contact can etch all or a portion of the cap layer 144.

FIG. 1E-1F illustrate an embodiment where a portion 160 of the cap layer 144 located at a bottom 162 of the trench 158 has been partially etched by etch processes performed after formation of the cap layer 144 and prior to formation of the metal contact. In some embodiments, the portion 160 of the cap layer 144 can be entirely etched away prior to metal contact formation. Portions 164 of the cap layer 144 covered by the isolation region 156 can remain unetched or etched to a lesser degree than the portion 160 of the cap layer 144 by the etch processes performed after formation of the cap layer 144 and prior to formation of the metal contact. Thus, in some embodiments, the cap layer 144 may be only positioned adjacent to at least a portion of the semiconductor layer 140 after completion of a semiconductor manufacturing process. In some embodiments, the cap layer 144 is not etched between cap layer formation and metal contact formation and is substantially the same thickness along the span of the cap layer 144 between the gate stacks 104 and 108.

The isolation region 156 can be a suitable nitride or oxide, such as silicon dioxide ($SiO_2$), carbon-doped silicon dioxide (C-doped $SiO_2$, also known as CDO or organosilicate glass, which is a material that comprises silicon, oxygen, and carbon), fluorine-doped silicon dioxide (F-doped $SiO_2$, also known as fluorosilicate glass, which is a material that comprises fluorine, silicon, and oxygen), hydrogen-doped silicon dioxide (H-doped $SiO_2$, which is a material that comprises silicon, oxygen, and hydrogen), or silicon nitride ($Si_3N_4$, which is a material that comprises silicon and nitrogen). The gate dielectric layers 124 can comprise any of the gate dielectrics materials discussed below in regards to FIG. 6. The gate electrode layers 120 can comprise any of the gate electrodes materials discussed below in regards to FIG. 6.

Figure 1G:
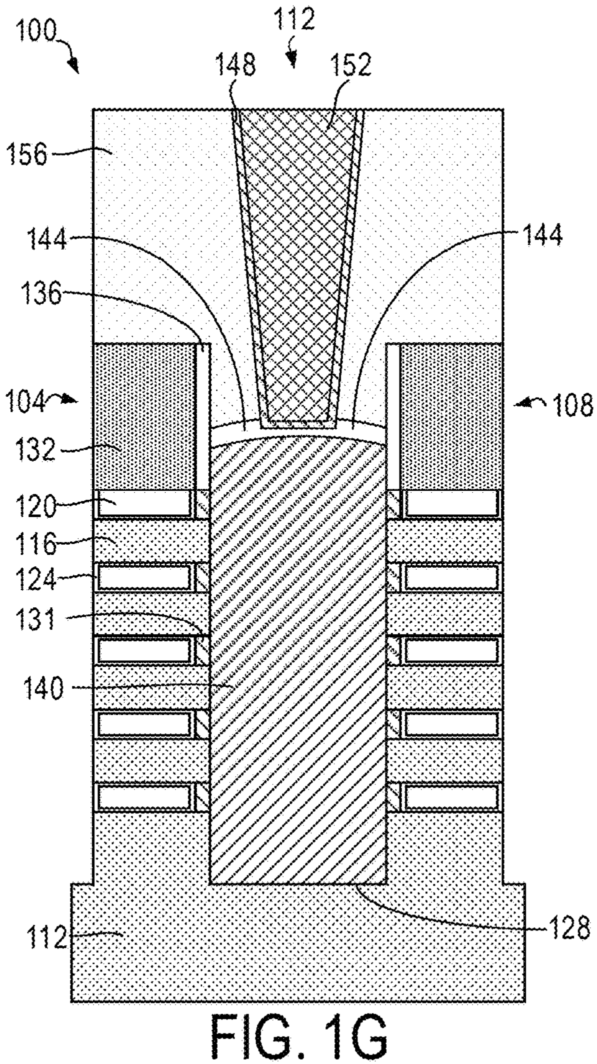
Figure 1H:
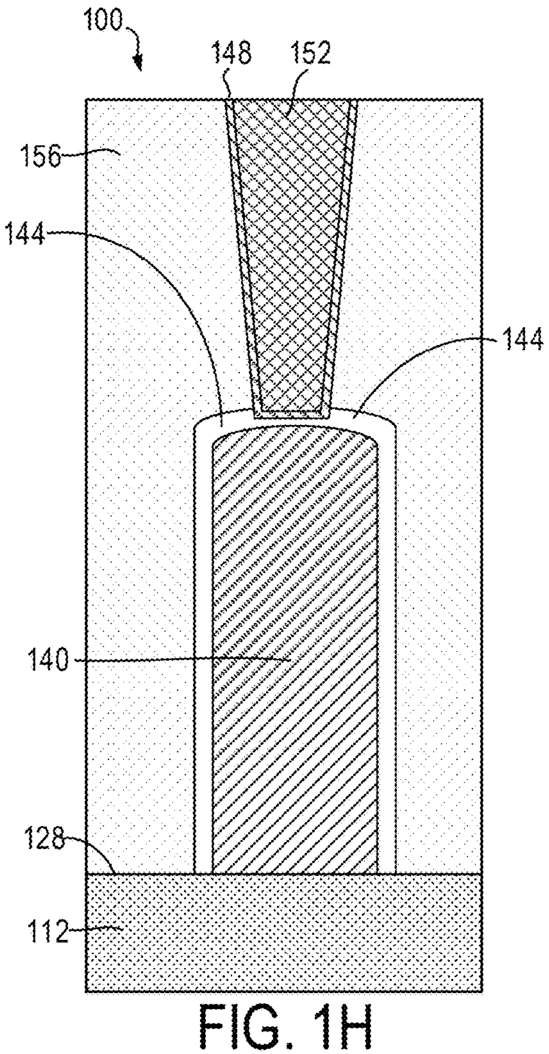

FIGS. 1G-1H illustrate cross-sectional views of the structure 100 after formation of a metal contact to the semiconductor layer 140. The metal contact comprises a barrier layer 148 and a contact metal (trench metal) layer 152. The metal contact is formed by first forming the barrier layer 148 and then forming the contact metal 152. The barrier layer 148 and the contact metal 152 can be formed by any thin layer formation process, such as chemical vapor deposition (CVD), plasma enhanced chemical vapor deposition (PECVD), physical vapor deposition (e.g., such as sputtering), or another suitable deposition process. In some embodiments, the metal contact does not comprise a barrier layer and the contact metal 152 is positioned adjacent to the cap layer 144 and the isolation regions 156.

The contact metal layer 152 can comprise one or more of tungsten, cobalt, titanium, gold, aluminum, molybdenum, chromium, and nickel, or another suitable metal or alloy. The barrier layer 148 can comprise cobalt (Co), ruthenium (Ru), tantalum (Ta), tantalum nitride (which is a material that comprises tantalum and nitrogen (e.g., TaN, $Ta_2N$, $Ta_3N_5$)), indium oxide ($In_2O_3$, which is a material that comprises indium and oxygen), tungsten nitride (which is a material that comprises tungsten and nitrogen (e.g., $W_2N$, WN, $WN_2$), and titanium nitride (TiN, which is a material that comprises titanium and nitrogen), or another suitable material.

Figure 1I:
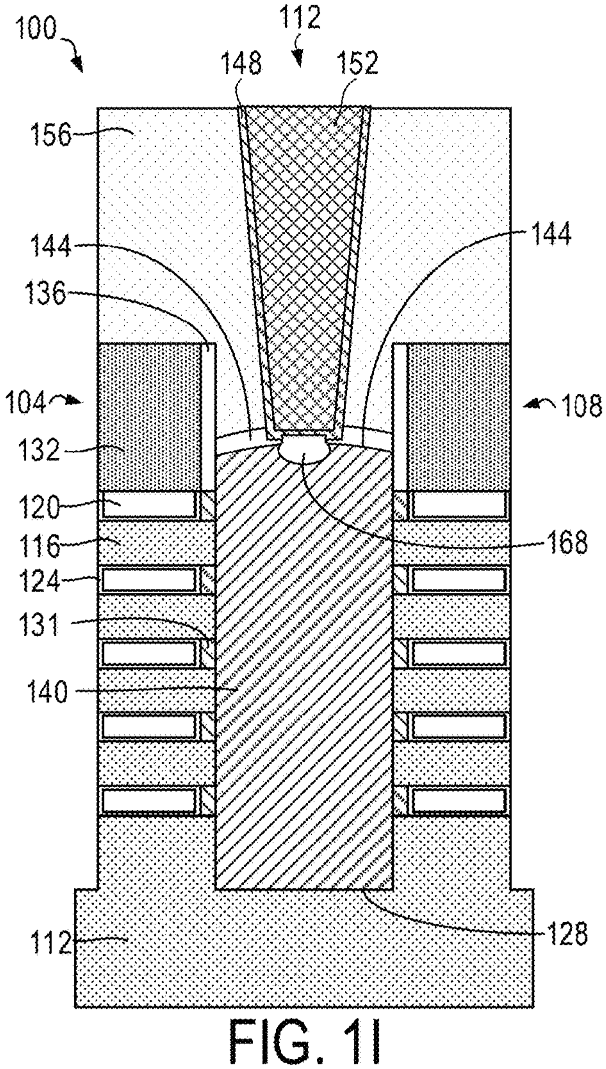
Figure 1J:
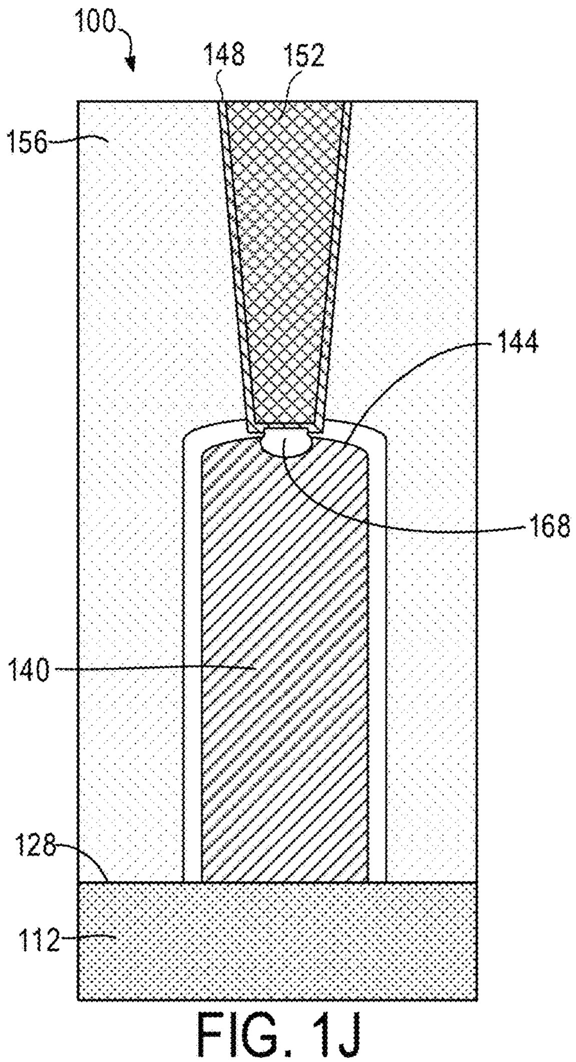

FIGS. 1I-1J illustrate cross-sectional views of the structure 100 after the structure 100 has been subjected to one or more annealing or other high-temperature processes subsequent to metal contact formation. In embodiments where the semiconductor layer 140 comprises germanium, a region 168 comprising silicon, germanium, and a metal of the contact metal layer 152 may be formed between the semiconductor layer 140 and the contact metal layer 152 or the barrier layer 148 due to the diffusion of germanium from the semiconductor layer 140 into the metal contact. In some embodiments, the region 168 can comprise a metal-silicon germanium alloy. The size of the region 168 can be smaller than in a structure similar to structure 100 but where a cap layer 144 was not formed on top of the semiconductor layer 140 after formation of the semiconductor layer 140. In some embodiments, no region 168 is formed between the semiconductor layer 140 and the contact metal layer 152.

The individual gate stacks 104 and 108 illustrated in FIGS. 1A, 1C, 1E, 1G, and 1I comprise four semiconductor layers 116 located above and separate from the substrate and five gate layers 120. In other embodiments, stacked GAAFETs can have different numbers of semiconductor layers and gate layers.

Figure 2A:
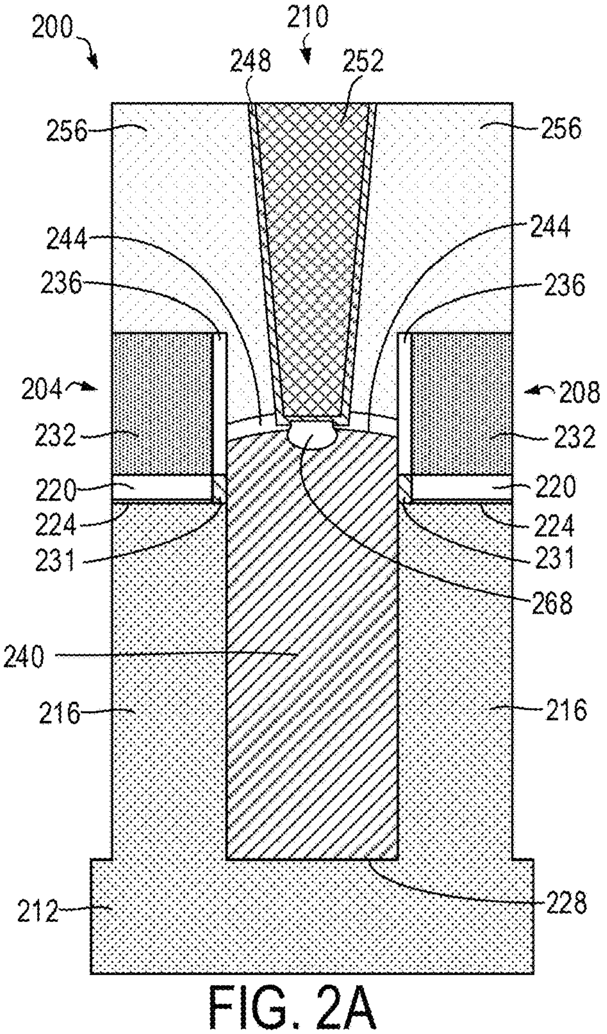
FIGS. 2A-2B illustrate an example metal contact to a FinFET source/drain layer.
Figure 2B:
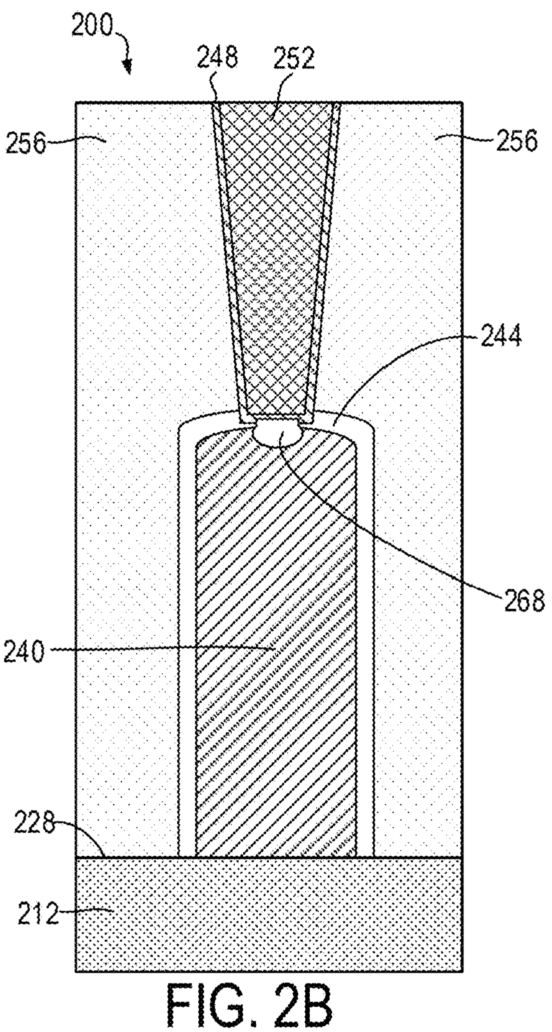

FIGS. 2A-2B illustrate an example metal contact to a FinFET source/drain layer. FIGS. 2A-2B illustrate cross-sectional views of a metal contact to an epitaxy source/drain layer grown in a cavity between gates of a pair of FinFETs after completion of a semiconductor manufacturing process. FIG. 2A illustrates a cross-sectional view of a structure 200 comprising a gate 204 of a first FinFET and a gate 208 of a second FinFET taken along a plane passing through the gates 204 and 208 and a contact region 210 between the gates 204 and 208. FIG. 2B illustrates a cross-sectional view orthogonal to the cross-sectional view illustrated in FIG. 2A. Referring to FinFET 720 illustrated in FIG. 7B, the cross-sectional view illustrated in FIG. 2A is taken along a plane similar to plane C in FIG. 7B (with the cross-sectional view in FIG. 2A illustrating two FinFETs and the plane C passing through just one FinFET) and FIG. 2B is taken along a plane similar to plane D in FIG. 7B, which is orthogonal to plane C. FIGS. 2A-2B thus illustrate FinFET cross-sectional views that are similar to the stacked GAAFET cross-sectional views illustrated in FIGS. 1I and 1J.

The gate stacks 204 and 208 are located on a substrate 212. The substrate 212 can be, for example, a bulk silicon, a silicon-on-insulator, or another suitable substrate. The individual gates 204 and 208 comprise a fin 216 extending from a surface 228 of the substrate 212. A gate electrode 220 is located above the fin 216 and a gate dielectric layer 224 is positioned between the gate electrode 220 and the fin 216. A cavity spacer 231 is positioned between the gate electrode-gate dielectric stack and a semiconductor layer 240. The fins 216 act as channel regions for the pair of FinFETs and the semiconductor layer 240 acts as a source/drain region for the FinFETs. The individual gates 204 and 208 further comprise a gate contact 232 located on the gate electrode 220 and a gate spacer 236 positioned adjacent to the gate contact 232.

The fins 216 and semiconductor layer 240 can comprise silicon, silicon and germanium, or another suitable semiconductor material. In some embodiments, the fins 216 and semiconductor layer 240 can comprise one or more n-dopants, such as phosphorous, arsenic, or antimony or another suitable n-type dopant. In other embodiments, the fins 216 and semiconductor layer 240 can comprise one or more p-type dopants, such as boron, gallium, indium, or another suitable p-type dopant. The fins 216 and semiconductor layer 240 can comprise different sets of n-type and p-type dopants. In some embodiments, the semiconductor layer 240 can be epitaxially grown. N-type dopants or p-dopants can be introduced into an epitaxially grown semiconductor layer 240 via in situ doping. In some embodiments, the semiconductor layer 240 is an epitaxially grown SiGe layer. In such embodiments, the epitaxially grown semiconductor layer 240 can have a high concentration of germanium throughout the semiconductor layer 240 or in one or more portions of the semiconductor layer 240, the high concentration of germanium enabling a low contact resistance.

A cap layer 244 positioned adjacent to the semiconductor layer 240 comprises boron and performs the same functions as the cap layer 144 described above. As with the cap layer 144, the cap layer 244 can be formed as part of the same processing step as formation of the semiconductor layer 240. The cap layer 244 is made thin to enable a low contact resistance. In some embodiments, the cap layer 244 has a thickness of 2 nm or less. In some embodiments, the cap layer 244 has a boron concentration in the range of $1\times10^{20}$-$1\times10^{22}$ atoms/cm$^3$ or equivalently, an atomic percentage of about 0.2-20%. In embodiments where the cap layer does not entirely comprise boron, the cap layer 244 can further comprise silicon, or silicon and germanium. In some embodiments, the cap layer can comprise a ternary alloy having the chemical formula $Si_xGe_yB_z$, where x, y, and z can have any value where x+y+z=1. In some embodiments, the ternary alloy can have the chemical formula $Si_{0.35}Ge_{0.6}B_{0.05}$.

FIGS. 2A-2B illustrate an embodiment where a portion of the cap layer 244 located at the bottom of the metal contact has been partially etched away by etch processes performed after formation of the cap layer 244 and formation of the metal contact. Portions of the cap layer 244 covered by isolation region 256 have not been etched or have been etched to a lesser degree than the portion of the cap layer located at the bottom of the metal contact. In some embodiments, only portions of the cap layer 244 under the isolation region 256 may remain prior to formation of the metal contact with the portion of the cap layer 244 located at the bottom of the metal contact having been etched away by etch processes occurring prior to formation of the metal contact. That is, in some embodiments, the cap layer 244 may be only positioned adjacent to at least a portion of the semiconductor layer 240 after completion of a semiconductor manufacturing process. In some embodiments, the cap layer 244 is not etched prior to metal contact formation and is substantially the same thickness along the span of the cap layer 244 between the gates 204 and 208.

The isolation region 256 can comprise a suitable nitride or oxide, such as any nitride oxide that can be used for the isolation region 156, as described above. The gate dielectric layers 224 can comprise any of the gate dielectrics discussed below in regards to FIG. 6. The gate electrode layers 220 can comprise any of the gate electrodes discussed below in regards to FIG. 6.

The metal contact of structure 200 comprises a barrier layer 248 and a contact metal layer 252. The barrier layer 248 and the contact metal layer 252 can be formed by any thin layer formation process, such as chemical vapor deposition (CVD), plasma enhanced chemical vapor deposition (PECVD), physical vapor deposition (e.g., such as sputtering), or another suitable deposition process. In some embodiments, the metal contact does not comprise a barrier layer 248 and the contact metal layer 252 is positioned adjacent to the cap layer 244 and the isolation region 256. The contact metal layer 252 can comprise any of the materials described above that can form the contact metal layer 152 and the barrier layer 248 can comprise any of the materials described above that can form the barrier layer 148.

In embodiments where the semiconductor layer 240 comprises germanium, a region 268 comprising silicon, germanium, and a metal of the contact metal layer 252 can be formed between the semiconductor layer 240 and the contact metal layer 252 or the barrier layer 248 due to diffusion of germanium from the semiconductor layer 240 into the metal contact during annealing and other high-temperature processes performed subsequent to metal contact formation. In some embodiments, the region 268 can comprise a metal-silicon germanium alloy. The size of the region 268 can be smaller than in a structure similar to structure 200 where a cap layer 244 was not formed on top of the semiconductor layer 240 after formation of the semiconductor layer 240. In some embodiments, no region 268 is formed between the semiconductor layer 240 and the contact metal layer 252 or the barrier layer 248.

Figure 3A:
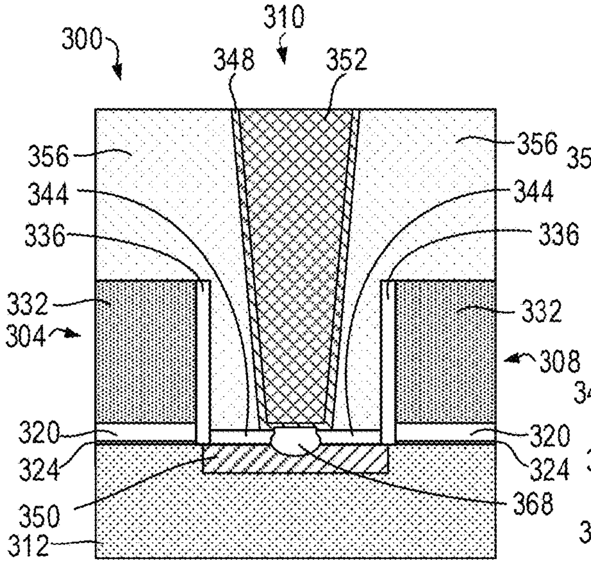
FIGS. 3A-3B illustrate an example metal contact to a planar FET source/drain layer.
Figure 3B:
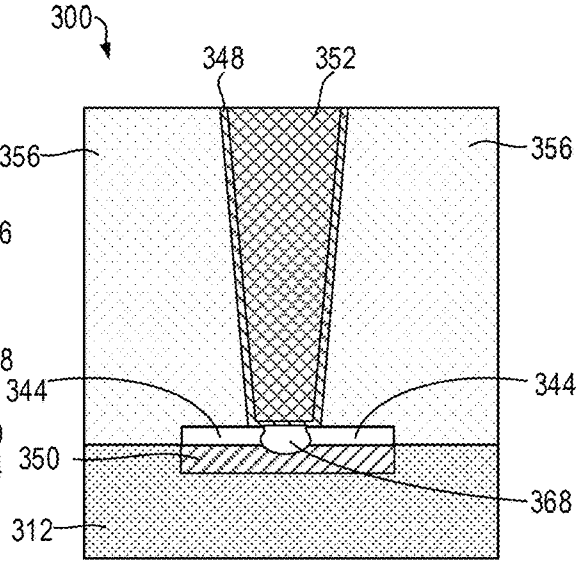

FIGS. 3A-3B illustrate an example metal contact to a planar FET source/drain layer. FIGS. 3A-3B illustrate cross-sectional views of a metal contact to a semiconductor layer between a pair of planar FETs after completion of a semiconductor manufacturing process. FIG. 3A illustrates a cross-sectional view of a structure 300 comprising a gate 304 of a first planar FET and a gate 308 of a second planar FET taken along a plane passing through the gates 304 and 308 and a contact region 310 between the gates 304 and 308. FIG. 3B illustrates a cross-sectional view orthogonal to the cross-sectional view illustrated in FIG. 3A. Referring to the planar FET 700 illustrated in FIG. 7A, the cross-sectional view illustrated in FIG. 3A is taken along a plane similar to plane E in FIG. 7A (with the cross-sectional view in FIG. 3A illustrating two planar FETs and the plane E passing through just one planar FET) and FIG. 3B is taken along a plane similar to plane F in FIG. 7A, which is orthogonal to plane E. FIGS. 3A-3B thus illustrate planar FET cross-sectional views that are similar to the stacked GAAFET cross-sectional views illustrated in FIGS. 1I and 1J and the FinFET cross-sectional views illustrated in FIGS. 2A-2B.

The gates 304 and 308 are located on a substrate 312. The substrate 312 can be a bulk silicon substrate, a silicon-on-insulator substrate, or another suitable substrate. The individual gates 304 and 308 comprise a gate electrode 320 located on the substrate 312 and a gate dielectric 324 positioned between the gate electrode 320 and the substrate 312. An n-doped or p-doped source/drain region 350 extends between the planar FETs. The individual gates 304 and 308 further comprise a gate contact 332 located on the gate electrode 320 and a gate spacer 336 positioned adjacent to the gate contact 332, the gate electrode 320, and the gate dielectric 324.

The source/drain region 350 can comprise silicon, silicon and germanium, or another suitable semiconductor material. In some embodiments, the source/drain region 350 can comprise one or more n-dopants, such as phosphorous, arsenic, antimony, or another suitable n-type dopant. In other embodiments, the source/drain region 350 can comprise one or more p-type dopants, such as boron, gallium, indium, or another suitable p-type dopant. In some embodiments, the source/drain region 350 can be an epitaxial layer. N-type dopants or p-dopants can be introduced into an epitaxially grown source/drain region 350 via in situ doping. In some embodiments, the source/drain region 350 is an epitaxially grown SiGe layer. In such embodiments, the epitaxially grown source/drain region 350 can have a high concentration of germanium throughout the source/drain region 350 or one or more portions of the semiconductor layer 340, the high concentration of germanium enabling a low contact resistance.

A cap layer 344 positioned adjacent to the source/drain region 350 comprises boron and performs the same functions as the cap layer 144 described above. The cap layer 344 is made thin to enable a low contact resistance. In some embodiments, the thickness of the cap layer 344 is 2 nm or less. In some embodiments, the cap layer 344 has a boron concentration in the range of about 10-100%. In embodiments where the cap layer does not entirely comprise boron, the cap layer 344 can further comprise silicon or silicon and germanium. In some embodiments, the cap layer can comprise a ternary alloy having the chemical formula $Si_xGe_yB_z$, where x, y, and z can have any value where x+y+z=1.

FIGS. 3A-3B illustrate an embodiment where a portion of the cap layer 344 located at a bottom of the metal contact has been partially etched away by etch processes performed after formation of the cap layer 344 and prior to formation of the metal contact. Portions of the cap layer 344 covered by isolation region 356 have not been etched or have been etched to a lesser degree than the portion of the cap layer. In some embodiments, only portions of the cap layer 344 under the isolation region 356 may remain prior to formation of the metal contact with the portion of the cap layer 344 having been etched away by etch processes occurring prior to formation of the metal contact. That is, in some embodiments, the cap layer 344 may be only positioned adjacent to at least a portion of the semiconductor layer 340 prior to formation of the metal contact or after the completion of a semiconductor manufacturing process. In some embodiments, the cap layer 344 is not etched prior to metal contact formation and is substantially the same thickness along the span of the cap layer 344 between the gates 304 and 308.

The isolation region 356 can comprise a suitable nitride or oxide, such as any nitride oxide that can be used for the isolation region 156, as described above. The gate dielectric layers 324 can comprise any of the gate dielectrics discussed below in regards to FIG. 6 The gate electrode layers 320 can comprise any of the gate electrodes discussed below in regards to FIG. 6.

The metal contact of structure 300 comprises a barrier layer 348 and a contact metal layer 352. The barrier layer 348 and the contact metal layer 352 can be formed by any thin layer formation process, such as chemical vapor deposition (CVD), plasma enhanced chemical vapor deposition (PECVD), physical vapor deposition (e.g., such as sputtering), or another suitable deposition process. In some embodiments, the metal contact does not comprise a barrier layer 348 and the contact metal layer 352 is positioned adjacent to the cap layer 344 and the isolation region 356. The contact metal layer 352 can comprise any of the materials described above that can form the contact metal layer 152 and the barrier layer 348 can comprise any of the materials described above that can form the barrier layer 148.

In embodiments where the semiconductor layer 340 comprises germanium, a region 368 comprising silicon, germanium, and a metal of the contact metal layer 352 can be formed between the semiconductor layer 340 and the contact metal layer 352 or the barrier layer 348 due to the diffusion of germanium from the semiconductor layer 340 into the metal contact during annealing and other high-temperature processes performed subsequent to metal contact formation. In some embodiments, the region 368 can comprise a metal-silicon germanium alloy. The size of the region 368 can be smaller than in a structure similar to structure 300 where a cap layer 344 was not formed on top of the semiconductor layer 340 after formation of the semiconductor layer 340. In some embodiments, no region 368 is formed between the semiconductor layer 340 and the contact metal layer 352 or the barrier layer 348.

Thus, FIGS. 1A-1J, 2A-2B, and 3A-3B illustrate the formation of metal contacts to FET source/drain regions with a cap layer formed on top of the source/drain semiconductor region. The resulting metal contacts, which in some embodiments can be a boron-rich cap layer formed on top of an epitaxially grown p-type silicon germanium source/drain region, have a contact resistance that is thermally stable due to reduced germanium diffusion into the metal contact and a low contact resistance due to the thinness of the cap layer.

The technologies for forming metal contacts described herein can be utilized to form metal contacts to SiGe layers that are part of a source region or a drain region of a transistor, such as a planar FET, a FinFET, a gate-all-around FET (GAAFET), a stacked GAAFET, or another type of transistor. In other embodiments, the metal contact formation technologies disclosed herein can be utilized to form metal contacts to a backside of a wafer (the side of a wafer opposite to the side of the wafer upon which a plurality of active devices (e.g., electronic transistors, spintronic devices) are located).

Metal contacts to semiconductor layers or regions formed according to the technologies described herein can be selectively formed during fabrication of an integrated circuit component. That is, etch resistant cap layers can be formed on selected semiconductor layers or regions in an integrated circuit component while etch resistant cap layers are not formed on other semiconductor layers or regions. In one example of selective cap layer formation, cap layers are formed only on p-type SiGe layers that are source/drain regions of p-type FETs.

In such a selective etch resistant cap layer formation process, a mask can be formed over n-type source/drain regions using a photolithography and etching process prior to the cap layer formation process. Cap layers are then formed on the p-type SiGe source/drain layers, with n-type source/drain regions being protected from cap layer formation by the mask. After removal of the mask, metal contacts are formed to the n-type or p-type source/drain regions.

Figure 4:
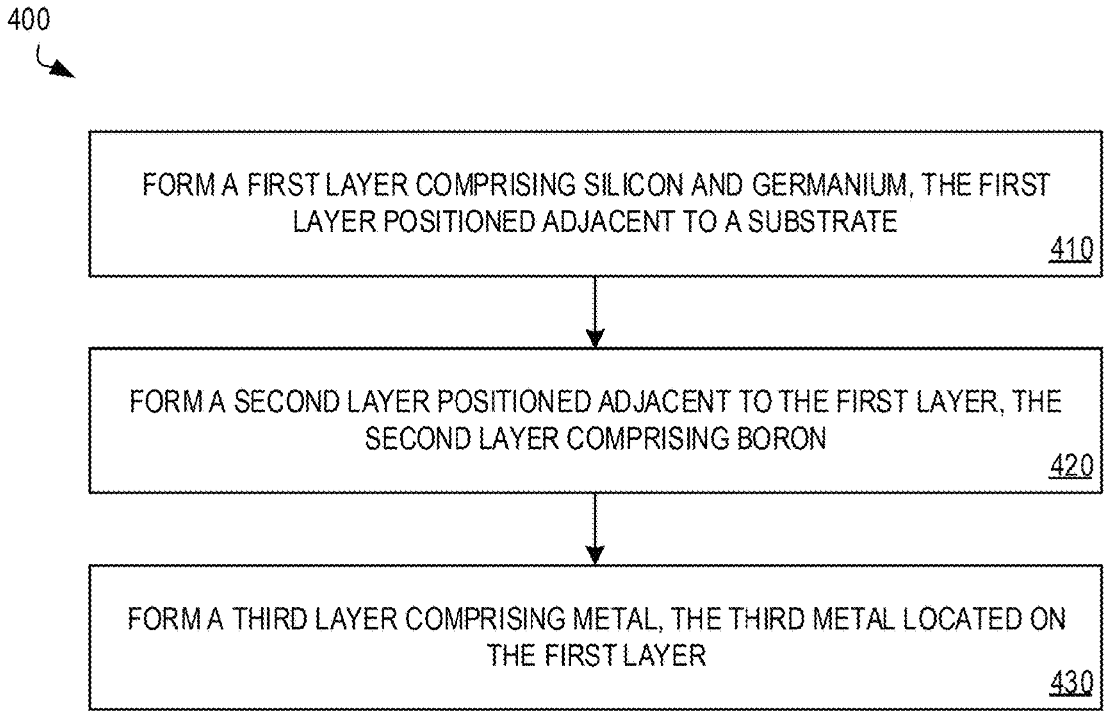
FIG. 4 is an example metal contact formation method.

FIG. 4 is an example metal contact formation method. The method 400 can be performed by, for example, a semiconductor device manufacturer. At 410, a first layer comprising silicon and germanium is formed, the first layer positioned adjacent to a substrate. At 420, a second layer positioned adjacent to the first layer is formed, the second layer comprising boron. At 430, a third layer comprising metal is formed, the third metal located on the first layer. In some embodiments, the method 400 can comprise additional elements. For example, the method 400 can further comprise performing one or more annealing steps on the substrate, the first layer, the second layer, and the third layer.

The metal contacts formed using the contact formation technologies described herein can be used in any processor unit, integrated circuit component, or computing system described or referenced herein. Such metal contacts can be fabricated as part of an integrated circuit structure. The integrated circuit structure can comprise a die substrate, such as a die substrate comprising silicon, and one or more interconnect or metal layers. A metal contact formed as described herein can connect to a line of an interconnect or metal layer by a via or by being positioned adjacent to a line of a metal layer. The integrated circuit structure can comprise other types of devices, such as electronic transistors (transistors such as CMOS transistors that operate through control of the flow of electric current and that do not rely upon the switching of the magnetization of a layer or component for operation) and/or magnetoelectric spin-orbit (MESO) devices that use magnetoelectric switching to convert an input voltage/charge into a magnetic spin state (e.g., charge-to-spin conversion) and further uses spin-orbit transduction to convert the magnetic spin state back into an output charge/voltage (e.g., spin-to-charge conversion). An integrated circuit component comprising metal contacts formed as described herein can be attached to a printed circuit board. In some embodiments, one or more additional integrated circuit components can be attached to the circuit board. In some embodiments, the printed circuit board and the integrated circuit component can be located in a computing device that comprises a housing that encloses the printed circuit board and the integrated circuit component.

Figure 5:
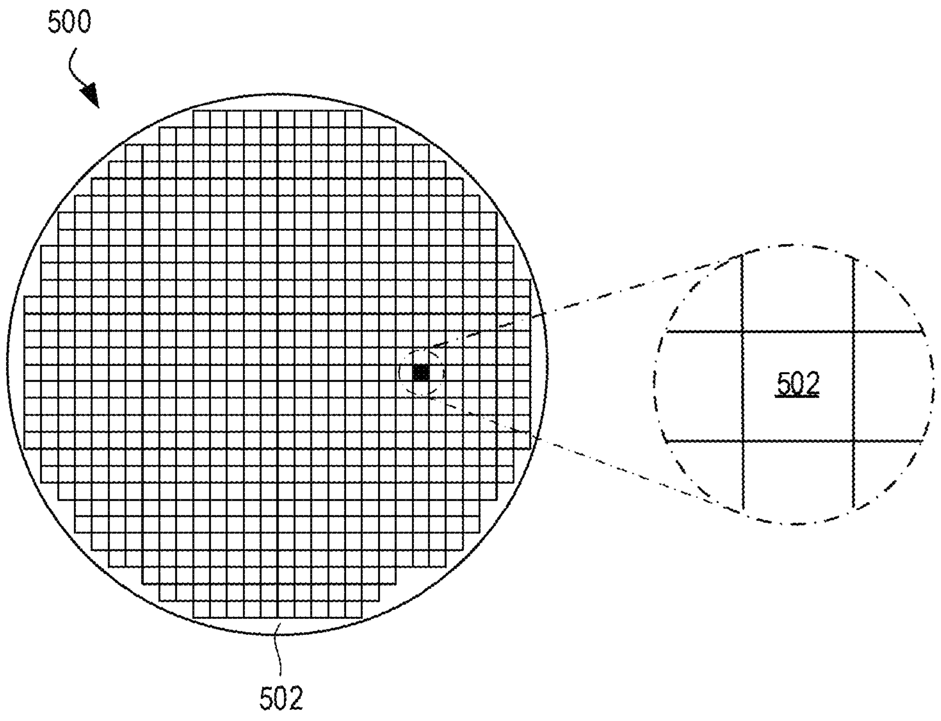
FIG. 5 is a top view of a wafer and dies that may be included in a microelectronic assembly, in accordance with any of the embodiments disclosed herein.

FIG. 5 is a top view of a wafer 500 and dies 502 that may include any of the metal contacts formed as described herein. The wafer 500 may be composed of semiconductor material and may include one or more dies 502 having integrated circuit structures formed on a surface of the wafer 500. The individual dies 502 may be a repeating unit of an integrated circuit product that includes any suitable integrated circuit. After the fabrication of the semiconductor product is complete, the wafer 500 may undergo a singulation process in which the dies 502 are separated from one another to provide discrete "chips" of the integrated circuit product. The die 502 may include one or more transistors (e.g., some of the transistors 640 of FIG. 6, discussed below), supporting circuitry to route electrical signals to the transistors, passive components (e.g., signal traces, resistors, capacitors, or inductors), and/or any other integrated circuit components. In some embodiments, the wafer 500 or the die 502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processor unit (e.g., the processor unit 902 of FIG. 9) or other logic that is configured to store information in the memory devices or execute instructions stored in the memory array. Various ones of the microelectronic assemblies disclosed herein may be manufactured using a die-to-wafer assembly technique in which some dies 502 are attached to a wafer 500 that include others of the dies 502, and the wafer 500 is subsequently singulated.

Figure 6:
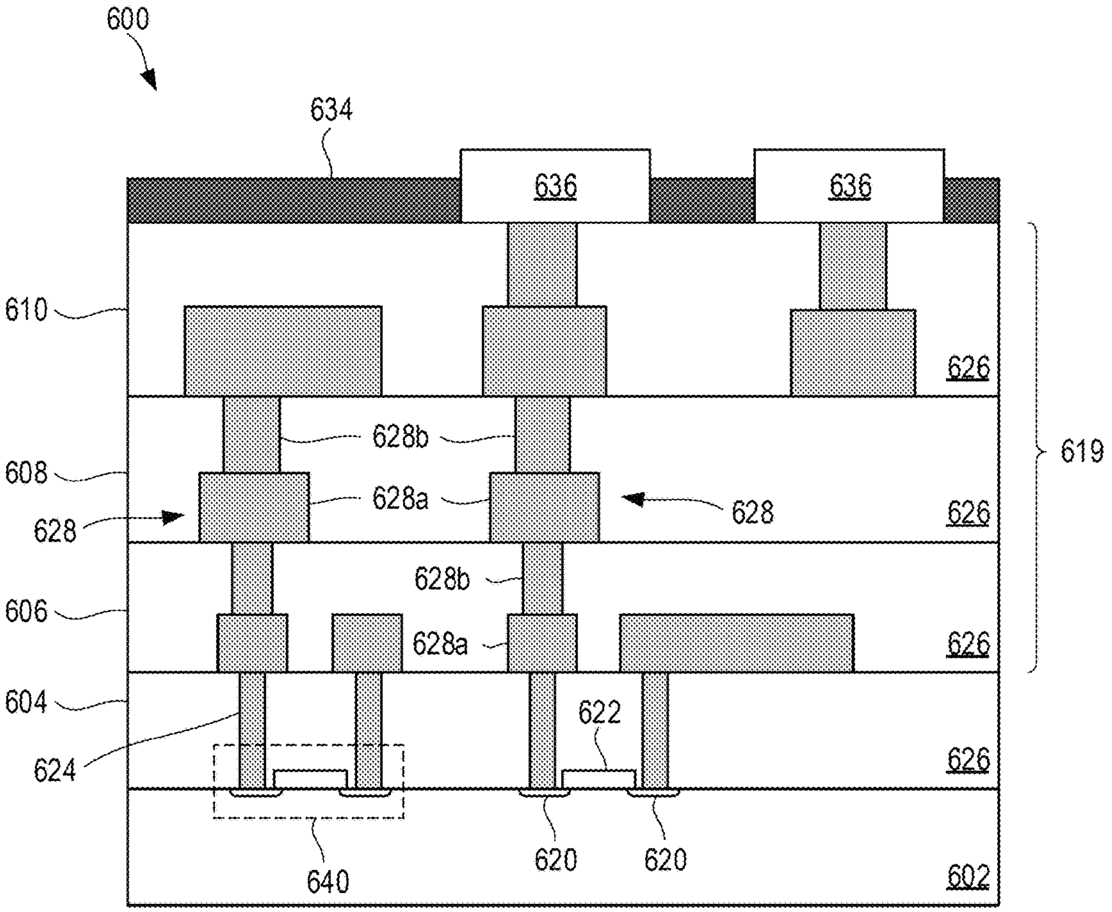
FIG. 6 is a cross-sectional side view of an integrated circuit device that may include metal contacts formed according to the technologies disclosed herein.

FIG. 6 is a cross-sectional side view of an integrated circuit device 600 that may include metal contacts formed according to the technologies disclosed herein. One or more of the integrated circuit devices 600 may be included in one or more dies 502 (FIG. 5). The integrated circuit device 600 may be formed on a die substrate 602 (e.g., the wafer 500 of FIG. 5) and may be included in a die (e.g., the die 502 of FIG. 5). The die substrate 602 may be a semiconductor substrate composed of semiconductor material systems including, for example, n-type or p-type materials systems (or a combination of both). The die substrate 602 may include, for example, a crystalline substrate formed using a bulk silicon or a silicon-on-insulator (SOI) substructure. In some embodiments, the die substrate 602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 602. Although a few examples of materials from which the die substrate 602 may be formed are described here, any material that may serve as a foundation for an integrated circuit device 600 may be used. The die substrate 602 may be part of a singulated die (e.g., the dies 502 of FIG. 5) or a wafer (e.g., the wafer 500 of FIG. 5).

The integrated circuit device 600 may include one or more device layers 604 disposed on the die substrate 602. The device layer 604 may include features of one or more transistors 640 (e.g., metal oxide semiconductor field-effect transistors (MOSFETs)) formed on the die substrate 602. The transistors 640 may include, for example, one or more source and/or drain (S/D) regions 620, a gate 622 to control current flow between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 7A-7G are simplified perspective views of example planar, FinFET, gate-all-around, and stacked gate-all-around transistors. The transistors illustrated in FIGS. 7A-7G are formed on a substrate 716 having a surface 708. Isolation regions 714 separate the source and drain regions of the transistors from other transistors and from a bulk region 718 of the substrate 716.

Figure 7B:
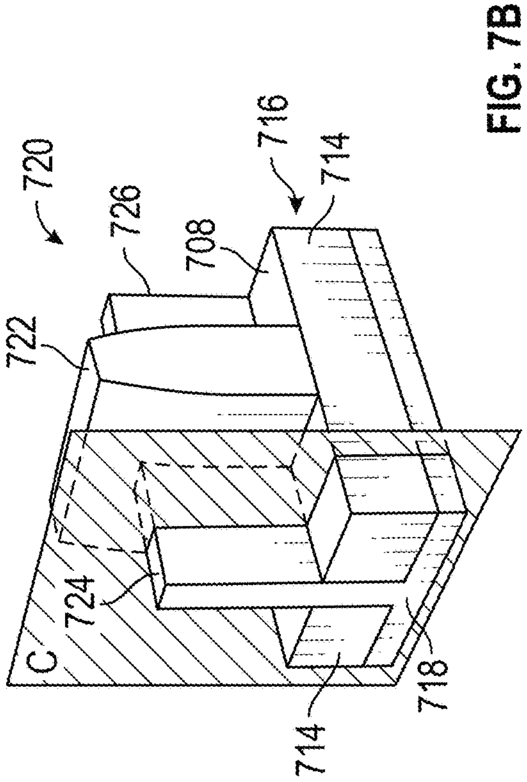
FIGS. 7A-7G are perspective views of example planar, FinFET, gate-all-around, and stacked gate-all-around transistors.
Figure 7D:
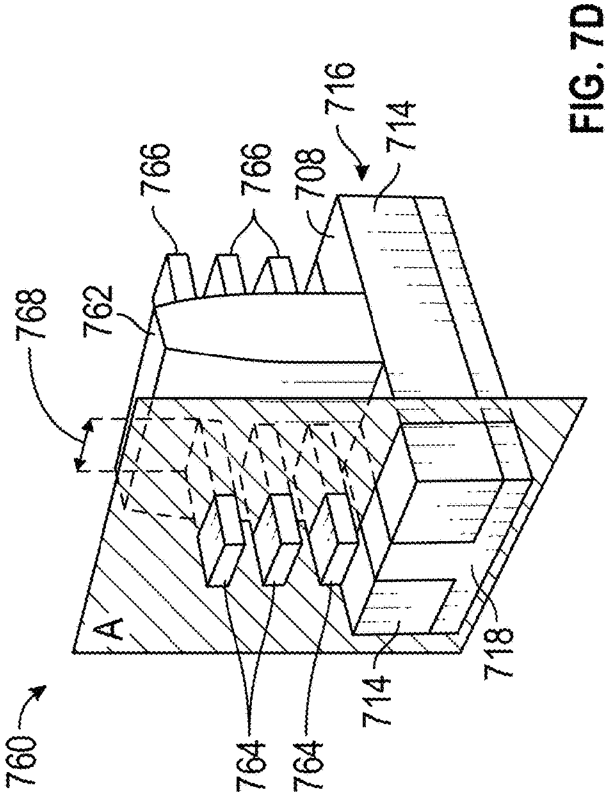
Figure 7A:
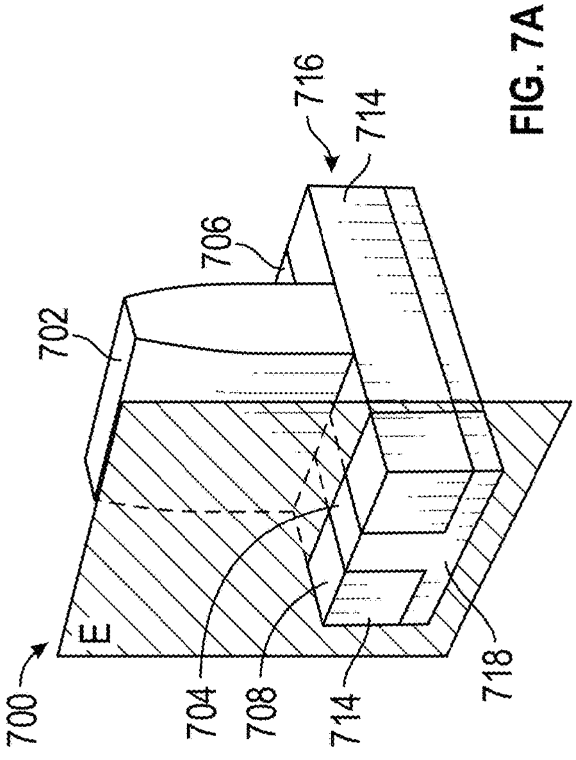
Figure 7C:
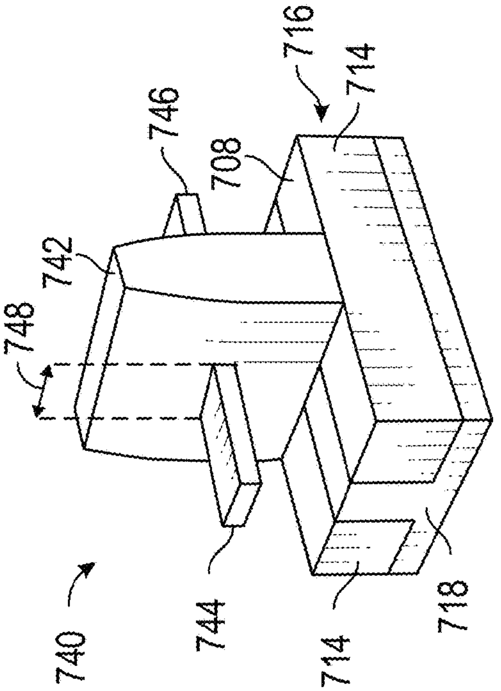
Figure 7F:
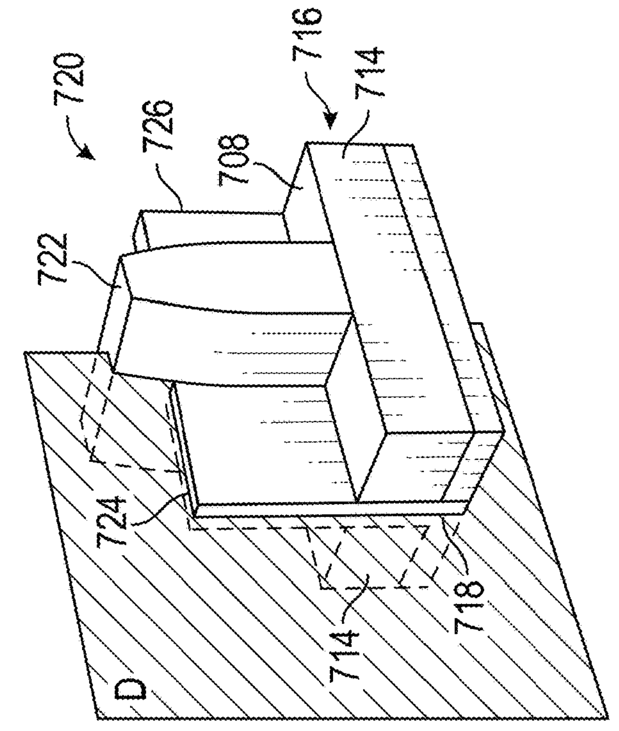
Figure 7E:
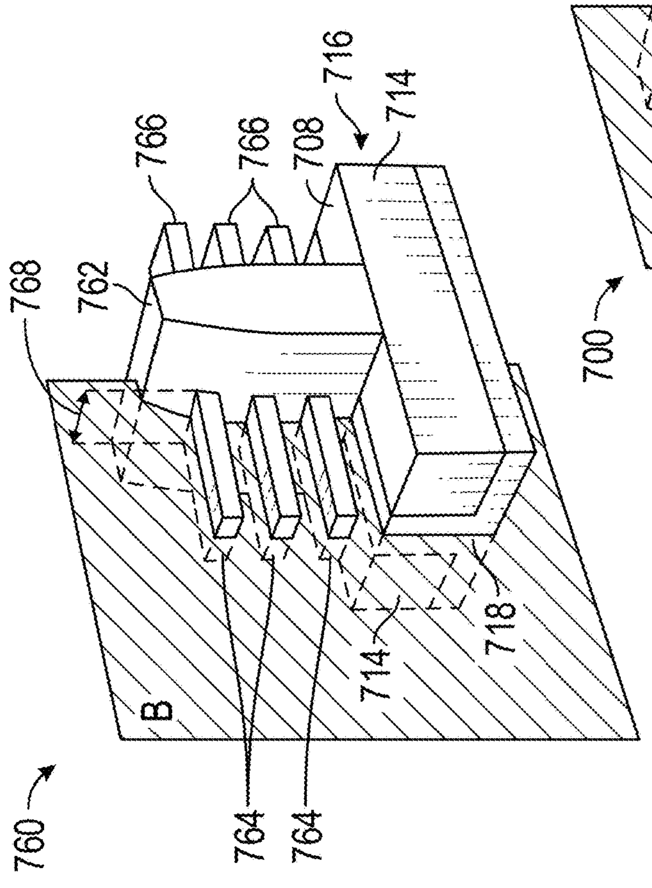
Figure 7G:
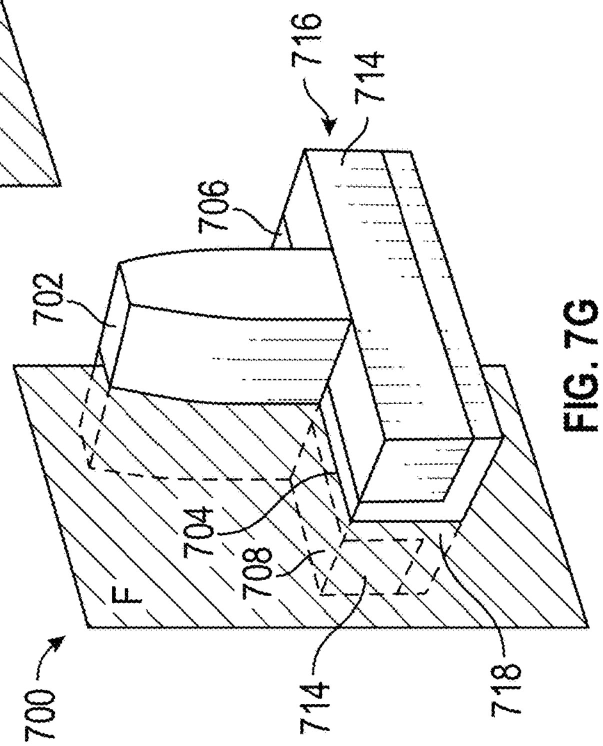

FIGS. 7A and 7G are perspective views of an example planar transistor 700 comprising a gate 702 that controls current flow between a source region 704 and a drain region 706. The transistor 700 is planar in that the source region 704 and the drain region 706 are planar with respect to the substrate surface 708.

FIGS. 7B and 7F are perspective views of an example FinFET transistor 720 comprising a gate 722 that controls current flow between a source region 724 and a drain region 726. The transistor 720 is non-planar in that the source region 724 and the drain region 726 comprise "fins" that extend upwards from the substrate surface 708. As the gate 722 encompasses three sides of the semiconductor fin that extends from the source region 724 to the drain region 726, the transistor 720 can be considered a tri-gate transistor. FIG. 7B illustrates one S/D fin extending through the gate 722, but multiple S/D fins can extend through the gate of a FinFET transistor.

FIG. 7C is a perspective view of a gate-all-around (GAA) transistor 740 comprising a gate 742 that controls current flow between a source region 744 and a drain region 746. The transistor 740 is non-planar in that the source region 744 and the drain region 746 are elevated from the substrate surface 708.

FIGS. 7D and 7D are perspective view of a stacked GAA transistor 760 comprising a gate 762 that controls current flow between multiple elevated source regions 764 and multiple elevated drain regions 766. The transistor 760 is a stacked GAA transistor as the gate controls the flow of current between multiple elevated S/D regions stacked on top of each other. The transistors 740 and 760 are considered gate-all-around transistors as the gates encompass all sides of the semiconductor portions that extends from the source regions to the drain regions. The transistors 740 and 760 can alternatively be referred to as nanowire, nanosheet, or nanoribbon transistors depending on the width (e.g., widths 748 and 768 of transistors 740 and 760, respectively) of the semiconductor portions extending through the gate.

Returning to FIG. 6, a transistor 640 may include a gate 622 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 640 along the source-channel-drain direction, the gate electrode may consist of a U-shaped structure that includes a bottom portion substantially parallel to the surface of the die substrate 602 and two sidewall portions that are substantially perpendicular to the top surface of the die substrate 602. In other embodiments, at least one of the metal layers that form the gate electrode may simply be a planar layer that is substantially parallel to the top surface of the die substrate 602 and does not include sidewall portions substantially perpendicular to the top surface of the die substrate 602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 620 may be formed within the die substrate 602 adjacent to the gate 622 of individual transistors 640. The S/D regions 620 may be formed using an implantation/diffusion process or an etching/deposition process, for example. In the former process, dopants such as boron, aluminum, antimony, phosphorous, or arsenic may be ion-implanted into the die substrate 602 to form the S/D regions 620. An annealing process that activates the dopants and causes them to diffuse farther into the die substrate 602 may follow the ion-implantation process. In the latter process, the die substrate 602 may first be etched to form recesses at the locations of the S/D regions 620. An epitaxial deposition process may then be carried out to fill the recesses with material that is used to fabricate the S/D regions 620. In some implementations, the S/D regions 620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 620 may be formed using one or more alternate semiconductor materials such as germanium or a group III-V material or alloy. In further embodiments, one or more layers of metal and/or metal alloys may be used to form the S/D regions 620.

Electrical signals, such as power and/or input/output (I/O) signals, may be routed to and/or from the devices (e.g., transistors 640) of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form a metallization stack (also referred to as an "ILD stack") 619 of the integrated circuit device 600.

The interconnect structures 628 may be arranged within the interconnect layers 606-610 to route electrical signals according to a wide variety of designs; in particular, the arrangement is not limited to the particular configuration of interconnect structures 628 depicted in FIG. 6. Although a particular number of interconnect layers 606-610 is depicted in FIG. 6, embodiments of the present disclosure include integrated circuit devices having more or fewer interconnect layers than depicted.

In some embodiments, the interconnect structures 628 may include lines 628*a* and/or vias 628*b* filled with an electrically conductive material such as a metal. The lines 628*a* may be arranged to route electrical signals in a direction of a plane that is substantially parallel with a surface of the die substrate 602 upon which the device layer 604 is formed. For example, the lines 628*a* may route electrical signals in a direction in and out of the page and/or in a direction across the page from the perspective of FIG. 6. The vias 628*b* may be arranged to route electrical signals in a direction of a plane that is substantially perpendicular to the surface of the die substrate 602 upon which the device layer 604 is formed. In some embodiments, the vias 628*b* may electrically couple lines 628*a* of different interconnect layers 606-610 together.

The interconnect layers 606-610 may include a dielectric material 626 disposed between the interconnect structures 628, as shown in FIG. 6. In some embodiments, dielectric material 626 disposed between the interconnect structures 628 in different ones of the interconnect layers 606-610 may have different compositions; in other embodiments, the composition of the dielectric material 626 between different interconnect layers 606-610 may be the same. The device layer 604 may include a dielectric material 626 disposed between the transistors 640 and a bottom layer of the metallization stack as well. The dielectric material 626 included in the device layer 604 may have a different composition than the dielectric material 626 included in the interconnect layers 606-610; in other embodiments, the composition of the dielectric material 626 in the device layer 604 may be the same as a dielectric material 626 included in any one of the interconnect layers 606-610.

A first interconnect layer 606 (referred to as Metal 1 or "M1") may be formed directly on the device layer 604. In some embodiments, the first interconnect layer 606 may include lines 628*a* and/or vias 628*b*, as shown. The lines 628*a* of the first interconnect layer 606 may be coupled with contacts (e.g., the S/D contacts 624) of the device layer 604. The vias 628*b* of the first interconnect layer 606 may be coupled with the lines 628*a* of a second interconnect layer 608.

The second interconnect layer 608 (referred to as Metal 2 or "M2") may be formed directly on the first interconnect layer 606. In some embodiments, the second interconnect layer 608 may include via 628*b* to couple the lines 628*a* of the second interconnect layer 608 with the lines 628*a* of a third interconnect layer 610. Although the lines 628*a* and the vias 628*b* are structurally delineated with a line within individual interconnect layers for the sake of clarity, the lines 628*a* and the vias 628*b* may be structurally and/or materially contiguous (e.g., simultaneously filled during a dual-damascene process) in some embodiments.

The third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606. In some embodiments, the interconnect layers that are "higher up" in the metallization stack 619 in the integrated circuit device 600 (i.e., farther away from the device layer 604) may be thicker that the interconnect layers that are lower in the metallization stack 619, with lines 628*a* and vias 628*b* in the higher interconnect layers being thicker than those in the lower interconnect layers.

The integrated circuit device 600 may include a solder resist material 634 (e.g., polyimide or similar material) and one or more conductive contacts 636 formed on the interconnect layers 606-610. In FIG. 6, the conductive contacts 636 are illustrated as taking the form of bond pads. The conductive contacts 636 may be electrically coupled with the interconnect structures 628 and configured to route the electrical signals of the transistor(s) 640 to external devices. For example, solder bonds may be formed on the one or more conductive contacts 636 to mechanically and/or electrically couple an integrated circuit die including the integrated circuit device 600 with another component (e.g., a printed circuit board). The integrated circuit device 600 may include additional or alternate structures to route the electrical signals from the interconnect layers 606-610; for example, the conductive contacts 636 may include other analogous features (e.g., posts) that route the electrical signals to external components.

In some embodiments in which the integrated circuit device 600 is a double-sided die, the integrated circuit device 600 may include another metallization stack (not shown) on the opposite side of the device layer(s) 604. This metallization stack may include multiple interconnect layers as discussed above with reference to the interconnect layers 606-610, to provide conductive pathways (e.g., including conductive lines and vias) between the device layer(s) 604 and additional conductive contacts (not shown) on the opposite side of the integrated circuit device 600 from the conductive contacts 636.

In other embodiments in which the integrated circuit device 600 is a double-sided die, the integrated circuit device 600 may include one or more through silicon vias (TSVs) through the die substrate 602; these TSVs may make contact with the device layer(s) 604, and may provide conductive pathways between the device layer(s) 604 and additional conductive contacts (not shown) on the opposite side of the integrated circuit device 600 from the conductive contacts 636. In some embodiments, TSVs extending through the substrate can be used for routing power and ground signals from conductive contacts on the opposite side of the integrated circuit device 600 from the conductive contacts 636 to the transistors 640 and any other components integrated into the integrated circuit device 600, and the metallization stack 619 can be used to route I/O signals from the conductive contacts 636 to transistors 640 and any other components integrated into the integrated circuit device 600.

Multiple integrated circuit devices 600 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 8:
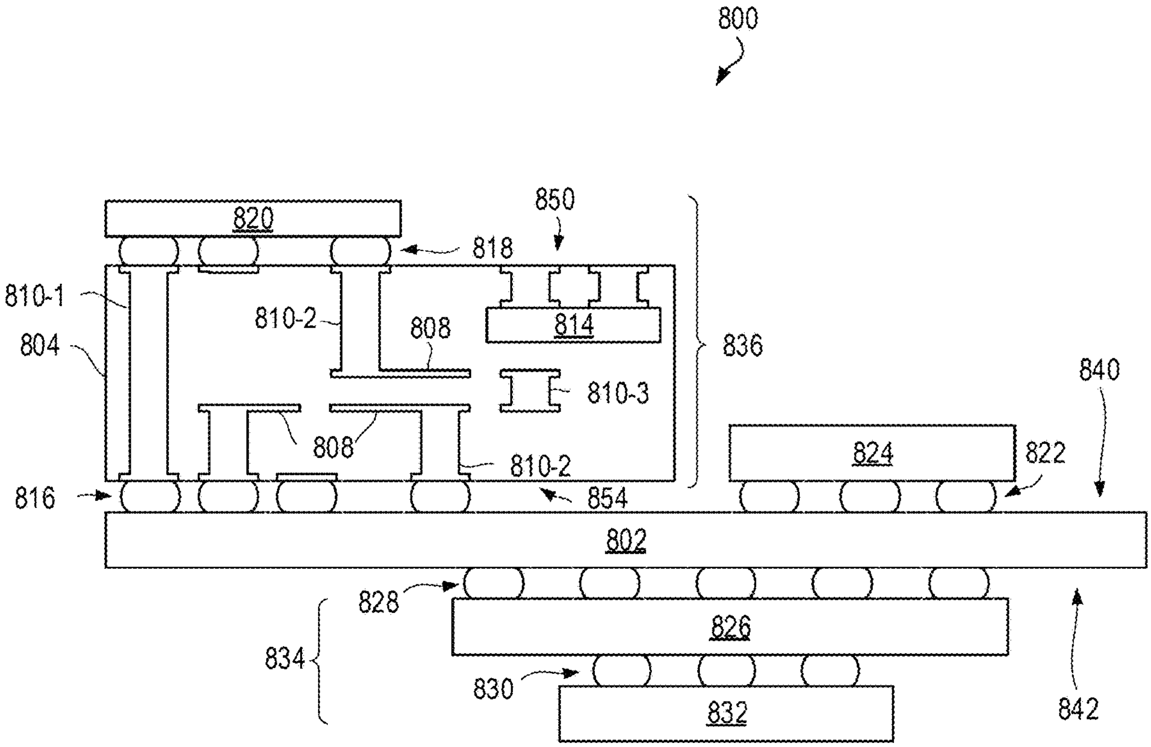
FIG. 8 is a cross-sectional side view of an integrated circuit device assembly that may include a microelectronic assembly, in accordance with any of the embodiments disclosed herein.

FIG. 8 is a cross-sectional side view of an integrated circuit device assembly 800 that may include any of the microelectronic assemblies disclosed herein. The integrated circuit device assembly 800 includes a number of components disposed on a circuit board 802 (which may be a motherboard, system board, mainboard, etc.). The integrated circuit device assembly 800 includes components disposed on a first face 840 of the circuit board 802 and an opposing second face 842 of the circuit board 802; generally, components may be disposed on one or both faces 840 and 842. Any of the integrated circuit components discussed below with reference to the integrated circuit device assembly 800 may take the form of any suitable ones of the embodiments of the microelectronic assemblies disclosed herein.

In some embodiments, the circuit board 802 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate. The integrated circuit device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 816 may serve as the coupling components illustrated or described for any of the substrate assembly or substrate assembly components described herein, as appropriate.

The package-on-interposer structure 836 may include an integrated circuit component 820 coupled to an interposer 804 by coupling components 818. The coupling components 818 may take any suitable form for the application, such as the forms discussed above with reference to the coupling components 816. Although a single integrated circuit component 820 is shown in FIG. 8, multiple integrated circuit components may be coupled to the interposer 804; indeed, additional interposers may be coupled to the interposer 804. The interposer 804 may provide an intervening substrate used to bridge the circuit board 802 and the integrated circuit component 820.

The integrated circuit component 820 may be a packaged or unpacked integrated circuit product that includes one or more integrated circuit dies (e.g., the die 502 of FIG. 5, the integrated circuit device 600 of FIG. 6) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 820, a single monolithic integrated circuit die comprises solder bumps attached to contacts on the die. The solder bumps allow the die to be directly attached to the interposer 804. The integrated circuit component 820 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 820 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 820 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 820 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 804 may spread connections to a wider pitch or reroute a connection to a different connection. For example, the interposer 804 may couple the integrated circuit component 820 to a set of ball grid array (BGA) conductive contacts of the coupling components 816 for coupling to the circuit board 802. In the embodiment illustrated in FIG. 8, the integrated circuit component 820 and the circuit board 802 are attached to opposing sides of the interposer 804; in other embodiments, the integrated circuit component 820 and the circuit board 802 may be attached to a same side of the interposer 804. In some embodiments, three or more components may be interconnected by way of the interposer 804.

In some embodiments, the interposer 804 may be formed as a PCB, including multiple metal layers separated from one another by layers of dielectric material and interconnected by electrically conductive vias. In some embodiments, the interposer 804 may be formed of an epoxy resin, a fiberglass-reinforced epoxy resin, an epoxy resin with inorganic fillers, a ceramic material, or a polymer material such as polyimide. In some embodiments, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to through hole vias 810-1 (that extend from a first face 850 of the interposer 804 to a second face 854 of the interposer 804), blind vias 810-2 (that extend from the first or second faces 850 or 854 of the interposer 804 to an internal metal layer), and buried vias 810-3 (that connect internal metal layers).

In some embodiments, the interposer 804 can comprise a silicon interposer. Through silicon vias (TSV) extending through the silicon interposer can connect connections on a first face of a silicon interposer to an opposing second face of the silicon interposer. In some embodiments, an interposer 804 comprising a silicon interposer can further comprise one or more routing layers to route connections on a first face of the interposer 804 to an opposing second face of the interposer 804.

The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art. In embodiments where the interposer is a non-printed circuit board The integrated circuit device assembly 800 may include an integrated circuit component 824 coupled to the first face 840 of the circuit board 802 by coupling components 822. The coupling components 822 may take the form of any of the embodiments discussed above with reference to the coupling components 816, and the integrated circuit component 824 may take the form of any of the embodiments discussed above with reference to the integrated circuit component 820.

The integrated circuit device assembly 800 illustrated in FIG. 8 includes a package-on-package structure 834 coupled to the second face 842 of the circuit board 802 by coupling components 828. The package-on-package structure 834 may include an integrated circuit component 826 and an integrated circuit component 832 coupled together by coupling components 830 such that the integrated circuit component 826 is disposed between the circuit board 802 and the integrated circuit component 832. The coupling components 828 and 830 may take the form of any of the embodiments of the coupling components 816 discussed above, and the integrated circuit components 826 and 832 may take the form of any of the embodiments of the integrated circuit component 820 discussed above. The package-on-package structure 834 may be configured in accordance with any of the package-on-package structures known in the art.

Figure 9:
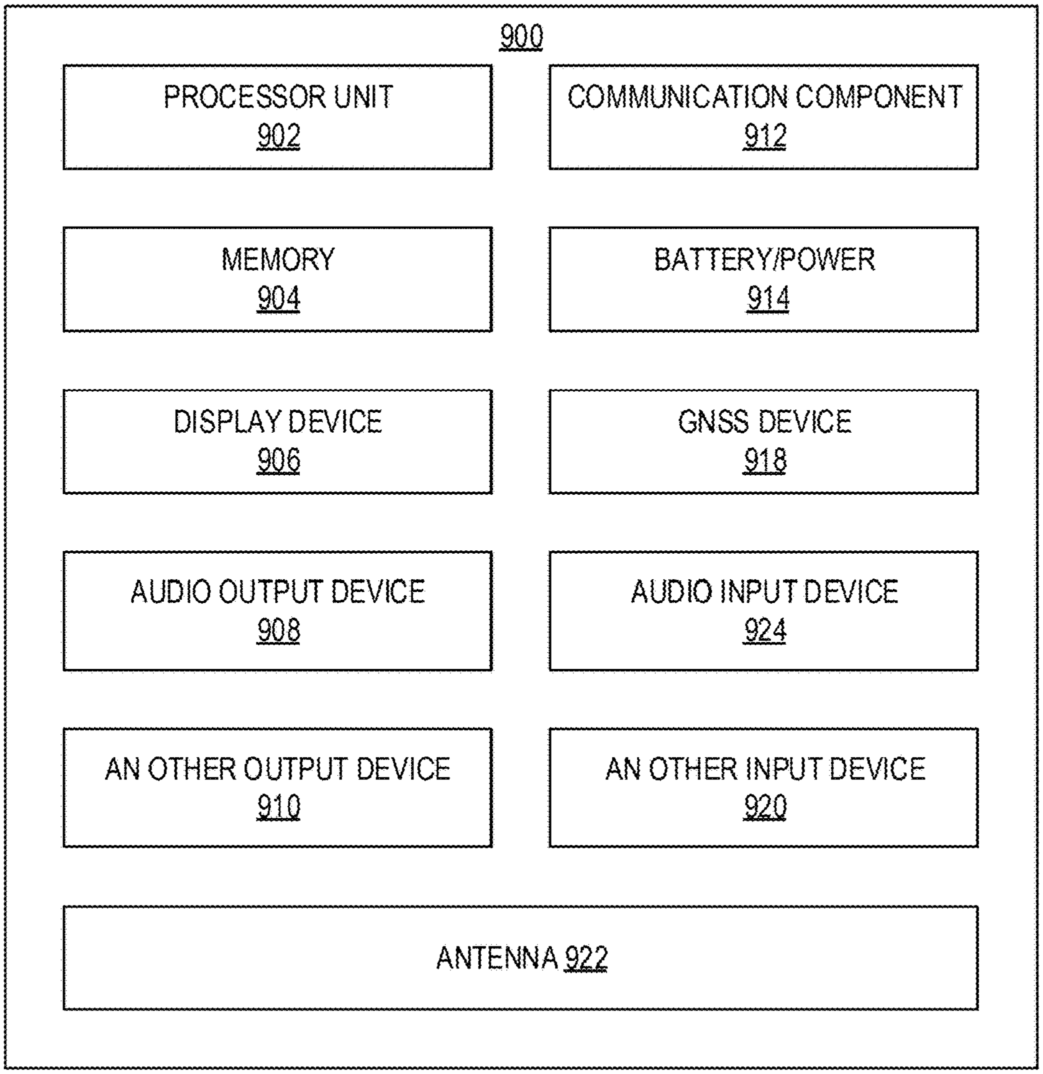
FIG. 9 is a block diagram of an example electrical device that may include an integrated circuit component comprising metal contacts formed according to the technologies disclosed herein.

FIG. 9 is a block diagram of an example electrical device that may include an integrated circuit component comprising metal contacts formed according to the technologies disclosed herein. For example, any suitable ones of the components of the electrical device 900 may include one or more of the integrated circuit device assemblies 800, integrated circuit components 820, integrated circuit devices 900, or integrated circuit dies 502 disclosed herein, and may be arranged in any of the microelectronic assemblies disclosed herein. A number of components are illustrated in FIG. 9 as included in the electrical device 900, but any one or more of these components may be omitted or duplicated, as suitable for the application. In some embodiments, some or all of the components included in the electrical device 900 may be attached to one or more motherboards mainboards, or system boards. In some embodiments, one or more of these components are fabricated onto a single system-on-a-chip (SoC) die.

Additionally, in various embodiments, the electrical device 900 may not include one or more of the components illustrated in FIG. 9, but the electrical device 900 may include interface circuitry for coupling to the one or more components. For example, the electrical device 900 may not include a display device 906, but may include display device interface circuitry (e.g., a connector and driver circuitry) to which a display device 906 may be coupled. In another set of examples, the electrical device 900 may not include an audio input device 924 or an audio output device 908, but may include audio input or output device interface circuitry (e.g., connectors and supporting circuitry) to which an audio input device 924 or audio output device 908 may be coupled.

The electrical device 900 may include one or more processor units 902 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 902 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 900 may include a memory 904, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 904 may include memory that is located on the same integrated circuit die as the processor unit 902. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 900 can comprise one or more processor units 902 that are heterogeneous or asymmetric to another processor unit 902 in the electrical device 900. There can be a variety of differences between the processing units 902 in a system in terms of a spectrum of metrics of merit including architectural, microarchitectural, thermal, power consumption characteristics, and the like. These differences can effectively manifest themselves as asymmetry and heterogeneity among the processor units 902 in the electrical device 900.

In some embodiments, the electrical device 900 may include a communication component 912 (e.g., one or more communication components). For example, the communication component 912 can manage wireless communications for the transfer of data to and from the electrical device 900. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 912 may operate in accordance with other wireless protocols in other embodiments. The electrical device 900 may include an antenna 922 to facilitate wireless communications and/or to receive other wireless communications (such as AM or FM radio transmissions).

In some embodiments, the communication component 912 may manage wired communications, such as electrical, optical, or any other suitable communication protocols (e.g., IEEE 802.3 Ethernet standards). As noted above, the communication component 912 may include multiple communication components. For instance, a first communication component 912 may be dedicated to shorter-range wireless communications such as Wi-Fi or Bluetooth, and a second communication component 912 may be dedicated to longer-range wireless communications such as global positioning system (GPS), EDGE, GPRS, CDMA, WiMAX, LTE, EV-DO, or others. In some embodiments, a first communication component 912 may be dedicated to wireless communications, and a second communication component 912 may be dedicated to wired communications.

The electrical device 900 may include battery/power circuitry 914. The battery/power circuitry 914 may include one or more energy storage devices (e.g., batteries or capacitors) and/or circuitry for coupling components of the electrical device 900 to an energy source separate from the electrical device 900 (e.g., AC line power).

The electrical device 900 may include a display device 906 (or corresponding interface circuitry, as discussed above). The display device 906 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 900 may include an audio output device 908 (or corresponding interface circuitry, as discussed above). The audio output device 908 may include any embedded or wired or wirelessly connected external device that generates an audible indicator, such speakers, headsets, or earbuds.

The electrical device 900 may include an audio input device 924 (or corresponding interface circuitry, as discussed above). The audio input device 924 may include any embedded or wired or wirelessly connected device that generates a signal representative of a sound, such as microphones, microphone arrays, or digital instruments (e.g., instruments having a musical instrument digital interface (MIDI) output). The electrical device 900 may include a Global Navigation Satellite System (GNSS) device 918 (or corresponding interface circuitry, as discussed above), such as a Global Positioning System (GPS) device. The GNSS device 918 may be in communication with a satellite-based system and may determine a geolocation of the electrical device 900 based on information received from one or more GNSS satellites, as known in the art.

The electrical device 900 may include an other output device 910 (or corresponding interface circuitry, as discussed above). Examples of the other output device 910 may include an audio codec, a video codec, a printer, a wired or wireless transmitter for providing information to other devices, or an additional storage device.

The electrical device 900 may include an other input device 920 (or corresponding interface circuitry, as discussed above). Examples of the other input device 920 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 900 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 900 may be any other electronic device that processes data. In some embodiments, the electrical device 900 may comprise multiple discrete physical components. Given the range of devices that the electrical device 900 can be manifested as in various embodiments, in some embodiments, the electrical device 900 can be referred to as a computing device or a computing system.

As used in this application and the claims, a list of items joined by the term "and/or" can mean any combination of the listed items. For example, the phrase "A, B and/or C" can mean A; B; C; A and B; A and C; B and C; or A, B and C. As used in this application and the claims, a list of items joined by the term "at least one of" can mean any combination of the listed terms. For example, the phrase "at least one of A, B or C" can mean A; B; C; A and B; A and C; B and C; or A, B, and C. Moreover, as used in this application and the claims, a list of items joined by the term "one or more of" can mean any combination of the listed terms. For example, the phrase "one or more of A, B and C" can mean A; B; C; A and B; A and C; B and C; or A, B, and C.

As used in this application and the claims, a list of items stated or recited as having a trait, feature, etc. preceded by the word "individual" or "respective" means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises sidewall, and C comprises a sidewall.

The disclosed methods, apparatuses, and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

The following examples pertain to additional embodiments of technologies disclosed herein.

Example 1 is an apparatus, comprising: a substrate comprising silicon; a first layer positioned adjacent to the substrate, the first layer comprising silicon and germanium; a second layer positioned adjacent to at least a portion of the first layer, the second layer comprising boron; and a third layer located on the first layer, the third layer comprising a metal.

Example 2 comprises the apparatus of example 1, the second layer further comprising silicon.

Example 3 comprises the apparatus of example 1, the second layer further comprising silicon and germanium.

Example 4 comprises the apparatus of any one of examples 1-3, wherein an atomic concentration of boron in the second layer is in a range of about 0.2-20%.

Example 5 comprises the apparatus of any one of examples 1-4, the first layer further comprising boron, gallium, or indium.

Example 6 comprises the apparatus of any one of examples 1-5, wherein the second layer is less than about 2 nm.

Example 7 comprises the apparatus of any one of examples 1-6, wherein the second layer is positioned between the first layer and the third layer.

Example 8 comprises the apparatus of any one of examples 1-7, wherein a fourth layer is positioned adjacent to the third layer, the fourth layer comprising: tantalum; ruthenium; titanium; titanium and nitrogen; indium; or indium and oxygen.

Example 9 comprises the apparatus any one of examples 1-8, further comprising a region between the third layer and first layer, the region comprising silicon, germanium, and the metal.

Example 10 comprises the apparatus any one of examples 1-9, wherein the metal comprises tungsten, cobalt, titanium, gold, aluminum, molybdenum, chromium, or nickel.

Example 11 comprises the apparatus of any one of examples 1-10, further comprising: one or more fourth layers located above and separate from the substrate, the one or more fourth layers comprising silicon, the one or more fourth layers stacked vertically with respect to a surface of the substrate, the first layer positioned adjacent to the one or more fourth layers; one or more fifth layers comprising a metal, the one or more fifth layers stacked vertically with respect to a surface of the substrate, individual of the fourth layers positioned between adjacent fifth layers; and one or more dielectric layers, individual of the dielectric layers comprising oxygen, individual of the dielectric layers encompassing one of the fifth layers.

Example 12 comprises the apparatus of example 11, wherein individual of the dielectric layers further comprise: silicon; hafnium; hafnium and silicon; lanthanum; lanthanum and aluminum; zirconium; zirconium and silicon; tantalum; titanium; barium, strontium, titanium; barium and titanium; strontium and titanium; yttrium; aluminum; or lead, scandium, and tantalum.

Example 13 comprises the apparatus of any one of examples 1-10, wherein the substrate comprises a fin extending from a surface of the substrate, the first layer positioned adjacent to the fin.

Example 14 comprises the apparatus of any one of examples 1-10, wherein the first layer is at least part of a source region or a drain region of a transistor.

Example 15 comprises the apparatus of any one of examples 1-14, wherein the apparatus is a processor unit.

Example 16 comprises the apparatus of any one of examples 1-14, wherein the apparatus is an integrated circuit component.

Example 17 comprises the apparatus of any one of examples 1-14, wherein the apparatus further comprises: a printed circuit board; and a first integrated circuit component attached to the printed circuit board, the first integrated circuit component comprising the substrate, the first layer, the second layer, and the third layer.

Example 18 comprises the apparatus of example 17, wherein the apparatus further comprises one or more second integrated circuit components attached to the printed circuit board.

Example 19 comprises the apparatus of example 17, wherein the apparatus further comprises a housing enclosing the printed circuit board and the first integrated circuit component.

Example 20 is a method, comprising: forming a first layer comprising silicon and germanium, the first layer positioned adjacent to a substrate; forming a second layer positioned adjacent to the first layer, the second layer comprising boron; and forming a third layer comprising metal, the third layer located on the first layer.

Example 21 comprises the method of example 20, the second layer further comprising silicon.

Example 22 comprises the method of example 20, the second layer further comprising silicon and germanium.

Example 23 comprises the method of any one of examples 20-22, wherein an atomic concentration of boron in the second layer is in a range of about 0.2-20%.

Example 24 comprises the method any one of examples 20-23, the first layer further comprising boron, gallium, or indium.

Example 25 comprises the method of example 24, wherein the boron, gallium, or indium is introduced into the first layer during formation of the first layer via in situ doping.

Example 26 comprises the method any one of examples 20-25, wherein the second layer is less than 2 nm.

Example 27 comprises the method any one of examples 20-26, wherein the second layer is positioned between the first layer and the third layer.

Example 28 comprises the method any one of examples 20-27, wherein a fourth layer is positioned adjacent to the third layer, the fourth layer comprising: tantalum; ruthenium; titanium; titanium and nitrogen; indium; or indium and oxygen.

Example 29 comprises the method of any one of examples 20-28, the method further comprising performing one or more annealing steps on the substrate, the first layer, the second layer, and the third layer.

Example 30 comprises the method of any one of examples 20-29, and a region between the third layer and first layer comprising the metal, silicon, and germanium.

Example 31 comprises the method of any one of examples 20-30, wherein the metal comprises tungsten, cobalt, titanium, gold, aluminum, molybdenum, chromium, or nickel.

Example 32 comprises the method of any one of examples 20-31, wherein forming the first layer and forming the second layer are performed as part of a same processing step.

Example 33 comprises the method of any one of examples 20-32, wherein forming the first layer and forming the second layer are performed in a manufacturing tool and the substrate is not removed from the manufacturing tool between forming the first layer and forming the second layer.

Example 34 comprises the method of any one of examples 20-33, wherein the first layer is formed in a cavity defined by a surface of the substrate, a first stack, and a second stack, individual of the first stack and the second stack comprising one or more fourth layers located above and separate from the substrate, the one or more fourth layers comprising silicon.

Example 35 comprises the method any one of examples 20-33, wherein the first layer is formed in a cavity defined by a surface of the substrate, a first fin comprising silicon and a second fin comprising silicon, the first layer positioned adjacent to the first fin and the second fin.

Example 36 comprises the method of any one of examples 20-33, wherein the first layer is at least part of a source region or a drain region of a transistor.

Example 37 comprises the method of any one of examples 20-36, wherein the substrate is a wafer.

The invention claimed is:

1. An apparatus, comprising:
- a substrate comprising silicon;
- a first layer positioned adjacent to the substrate, the first layer comprising silicon and germanium;
- a second layer positioned adjacent to at least a portion of the first layer, the second layer comprising boron, wherein the second layer includes a first etched portion, wherein a thickness of the second layer is 2 nanometers (nm) or less; and
- a third layer located on the first etched portion of the second layer, the third layer comprising a metal.

2. The apparatus of claim 1, the second layer further comprising silicon.

3. The apparatus of claim 1, the second layer further comprising silicon and germanium.

4. The apparatus of claim 1, wherein an atomic concentration of boron in the second layer is in a range of about 0.2-20%.

5. The apparatus of claim 1, the first layer further comprising boron, gallium, or indium.

6. The apparatus of claim 1, wherein the second layer is positioned between the first layer and the third layer.

7. The apparatus of claim 1, wherein a fourth layer is positioned adjacent to the third layer, the fourth layer comprising:
- tantalum;
- ruthenium;
- titanium;
- titanium and nitrogen;
- indium; or
- indium and oxygen.

8. The apparatus of claim 1, further comprising a region between the third layer and the first layer, the region comprising silicon, germanium, and the metal.

9. The apparatus of claim 1, wherein the metal comprises tungsten, cobalt, titanium, gold, aluminum, molybdenum, chromium, or nickel.

10. The apparatus of claim 1, further comprising:
- one or more fourth layers located above and separate from the substrate, the one or more fourth layers comprising silicon, the one or more fourth layers stacked vertically with respect to a surface of the substrate, the first layer positioned adjacent to the one or more fourth layers;
- one or more fifth layers comprising a metal, the one or more fifth layers stacked vertically with respect to a surface of the substrate, individual of the one or more fourth layers positioned between adjacent fifth layers; and
- one or more dielectric layers, individual of the one or more dielectric layers comprising oxygen, individual of the one or more dielectric layers encompassing one of the one or more fifth layers.

11. The apparatus of claim 10, wherein individual of the one or more dielectric layers further comprise:
- silicon;
- hafnium;
- hafnium and silicon;
- lanthanum;
- lanthanum and aluminum;
- zirconium;
- zirconium and silicon;
- tantalum;
- titanium;
- barium, strontium, titanium;
- barium and titanium;
- strontium and titanium;
- yttrium;
- aluminum; or
- lead, scandium, and tantalum.

12. The apparatus of claim 1, wherein the substrate comprises a fin extending from a surface of the substrate, the first layer positioned adjacent to the fin.

13. The apparatus of claim 1, wherein the first layer is at least part of a source region or a drain region of a transistor.

14. The apparatus of any one of claim 1, wherein the apparatus is an integrated circuit component.

15. The apparatus of any one of claim 1, wherein the apparatus further comprises:
- a printed circuit board; and
- a first integrated circuit component attached to the printed circuit board, the first integrated circuit component comprising the substrate, the first layer, the second layer, and the third layer.

16. The apparatus of claim 15, wherein the apparatus further comprises one or more second integrated circuit components attached to the printed circuit board.

17. The apparatus of claim 15, wherein the apparatus further comprises a housing enclosing the printed circuit board and the first integrated circuit component.

18. The apparatus of claim 1, wherein the second layer includes a second etched portion and a third etched portion on opposite sides of the first etched portion.

19. The apparatus of claim 1, wherein the first etched portion in the second layer is either a partially etched portion in the second layer or an entirely etched away portion through the second layer.

20. A method, comprising:
- forming a first layer comprising silicon and germanium, the first layer positioned adjacent to a substrate;
- forming a second layer positioned adjacent to the first layer, the second layer comprising boron having a thickness of 2 nanometers (nm) or less;
- etching the second layer to form an etched portion in the second layer; and
- forming a third layer comprising a metal, the third layer located on the first layer and on at least the etched portion of the second layer.

21. The method of claim 20, the second layer further comprising silicon or silicon and germanium.

22. The method of claim 20, wherein the second layer is positioned between the first layer and the third layer.

23. The method of claim 20, wherein the metal comprises tungsten, cobalt, titanium, gold, aluminum, molybdenum, chromium, or nickel.

24. The method of claim 20, wherein the first layer is formed in a cavity defined by a surface of the substrate, a first stack, and a second stack, individual of the first stack and the second stack comprising one or more fourth layers located above and separate from the substrate, the one or more fourth layers comprising silicon.

25. The method of claim 20, wherein the first layer is formed in a cavity defined by a surface of the substrate, a first fin comprising silicon and a second fin comprising silicon, the first layer positioned adjacent to the first fin and the second fin.

* * * * *